US006965329B2

(12) United States Patent
Nakagawa et al.

(10) Patent No.: US 6,965,329 B2
(45) Date of Patent: *Nov. 15, 2005

(54) MODULATION APPARATUS AND METHOD, AND DSV-CONTROL-BIT GENERATING METHOD

(75) Inventors: Toshiyuki Nakagawa, Kanagawa (JP); Minoru Tobita, Tokyo (JP); Hiroshige Okamura, Chiba (JP)

(73) Assignee: Sony Corporation, Tokyo (JP)

( * ) Notice: Subject to any disclaimer, the term of this patent is extended or adjusted under 35 U.S.C. 154(b) by 4 days.

This patent is subject to a terminal disclaimer.

(21) Appl. No.: 11/102,372

(22) Filed: Apr. 7, 2005

(65) Prior Publication Data

US 2005/0174266 A1 Aug. 11, 2005

Related U.S. Application Data

(63) Continuation of application No. 10/471,675, filed as application No. PCT/JP03/00501 on Jan. 22, 2003.

(30) Foreign Application Priority Data

Jan. 23, 2002 (JP) .......................... P2002-013776

(51) Int. Cl.[7] .......................... H03M 5/00; H03M 7/40
(52) U.S. Cl. .......................................... 341/58; 341/67
(58) Field of Search .............................. 341/58, 59, 67, 341/68; 369/47.19; 375/253

(56) References Cited

U.S. PATENT DOCUMENTS

| 5,451,943 | A | * | 9/1995 | Satomura | 341/58 |
| 5,506,581 | A | * | 4/1996 | Ino et al. | 341/58 |
| 6,072,756 | A | * | 6/2000 | Shigenobu | 369/47.19 |
| 6,268,812 | B1 | * | 7/2001 | Yoshimura | 341/68 |
| 6,359,930 | B1 | * | 3/2002 | Nakagawa et al. | 375/253 |
| 6,496,541 | B1 | * | 12/2002 | Kahlman et al. | 375/253 |
| 6,577,255 | B2 | * | 6/2003 | Hayami et al. | 341/59 |
| 6,765,511 | B2 | * | 7/2004 | Hayami | 341/59 |
| 6,778,104 | B2 | * | 8/2004 | Chen et al. | 341/59 |
| 6,861,965 | B2 | * | 3/2005 | Kayanuma et al. | 341/59 |

* cited by examiner

*Primary Examiner*—Patrick Wamsley
(74) *Attorney, Agent, or Firm*—Jay H. Maioli

(57) ABSTRACT

A modulation apparatus and method for more accurately determining a value of a control bit to be inserted into a data sequence and digital sum value (DSV) control bit generating method in which a data conversion unit supplies modulation-delimiter information including information regarding delimiters of modulation of a data sequence based on a conversion table to a modulation-delimiter detecting unit and supplies to a valid-delimiter detecting unit a DSV-segment-delimiter signal including information regarding a delimiter position of a DSV segment of the data sequence having the DSV control bit. The modulation-delimiter detecting unit detects modulation-delimiter positions based on the modulation-delimiter information supplied thereto and supplies a modulation-delimiter signal to the valid-delimiter detecting unit. The valid-delimiter detecting unit, based on the DSV-segment-delimiter signal supplied thereto, detects a valid-delimiter position for controlling timing for determining a DSV control bit of the relevant DSV segment from the modulation-delimiter positions represented by the modulation-delimiter signal supplied thereto.

1 Claim, 10 Drawing Sheets

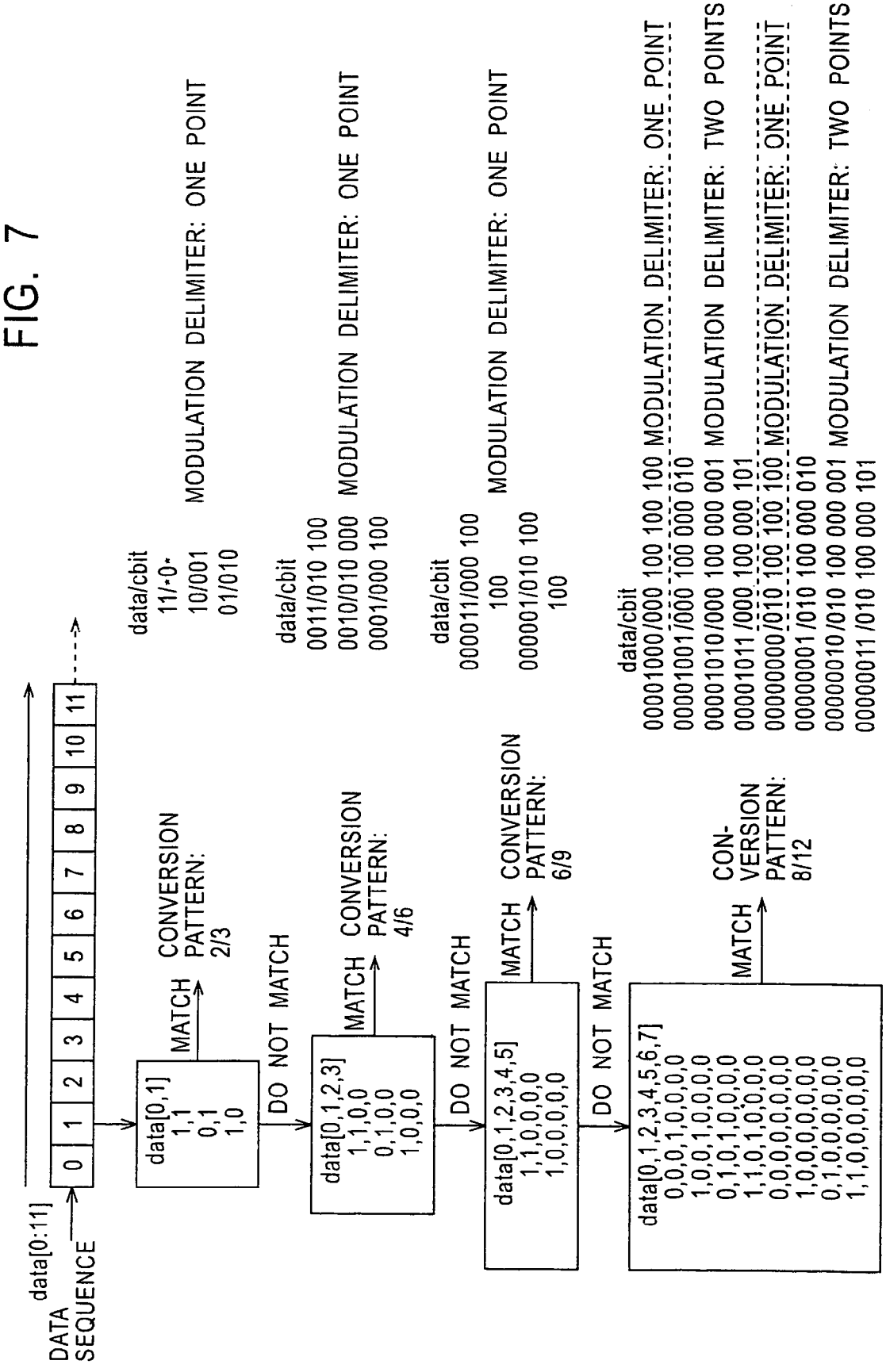

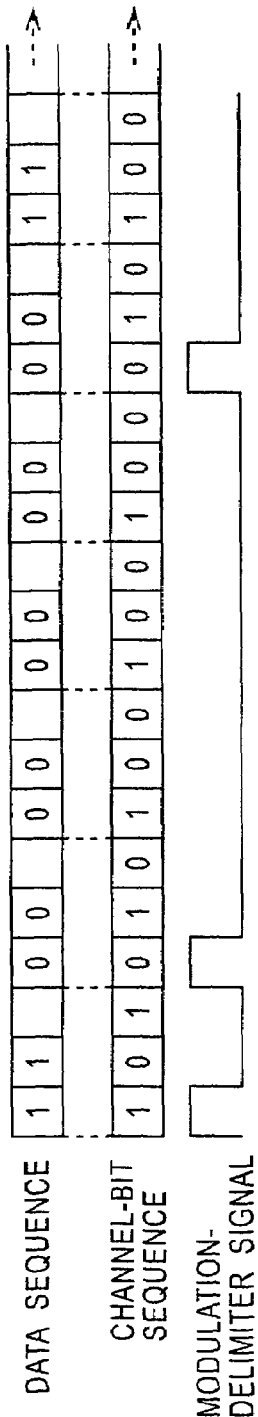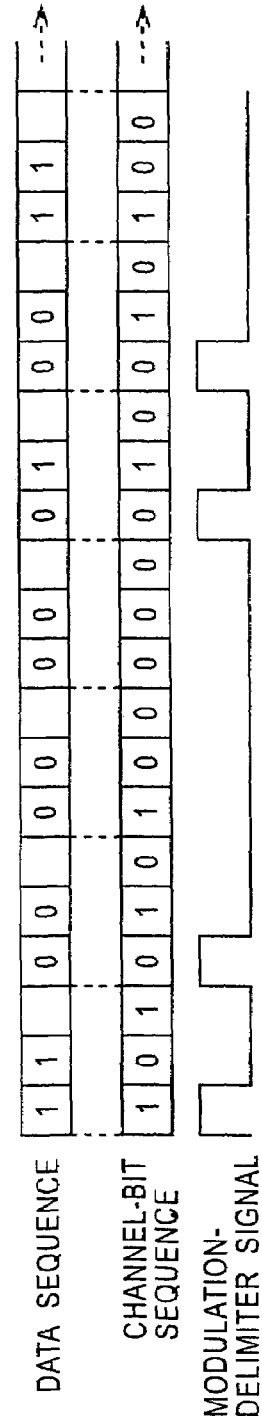

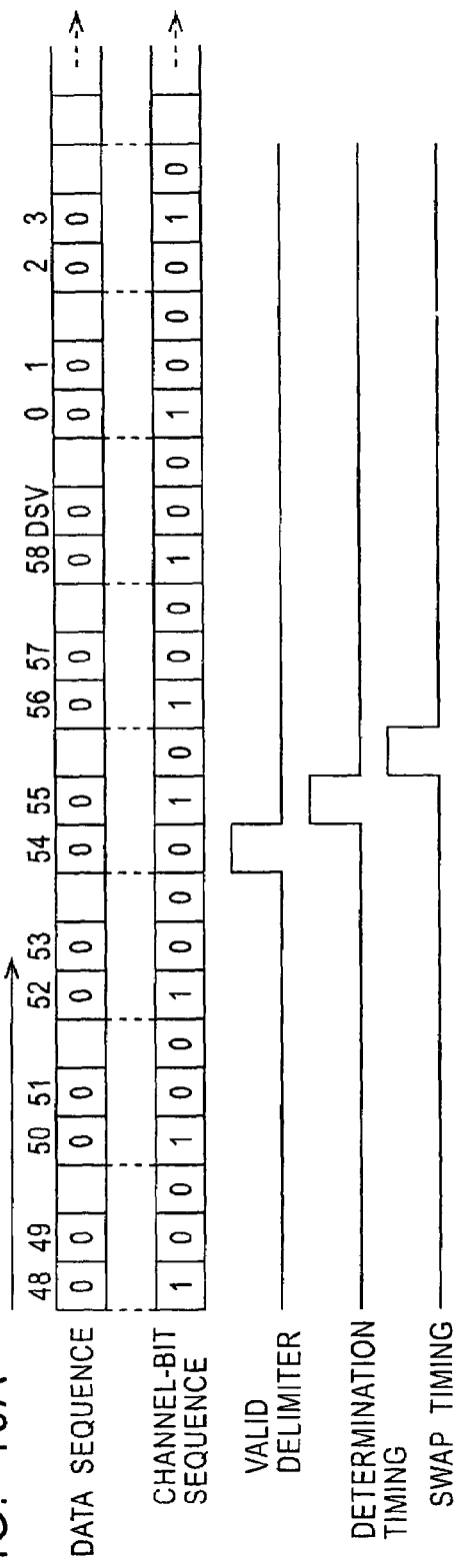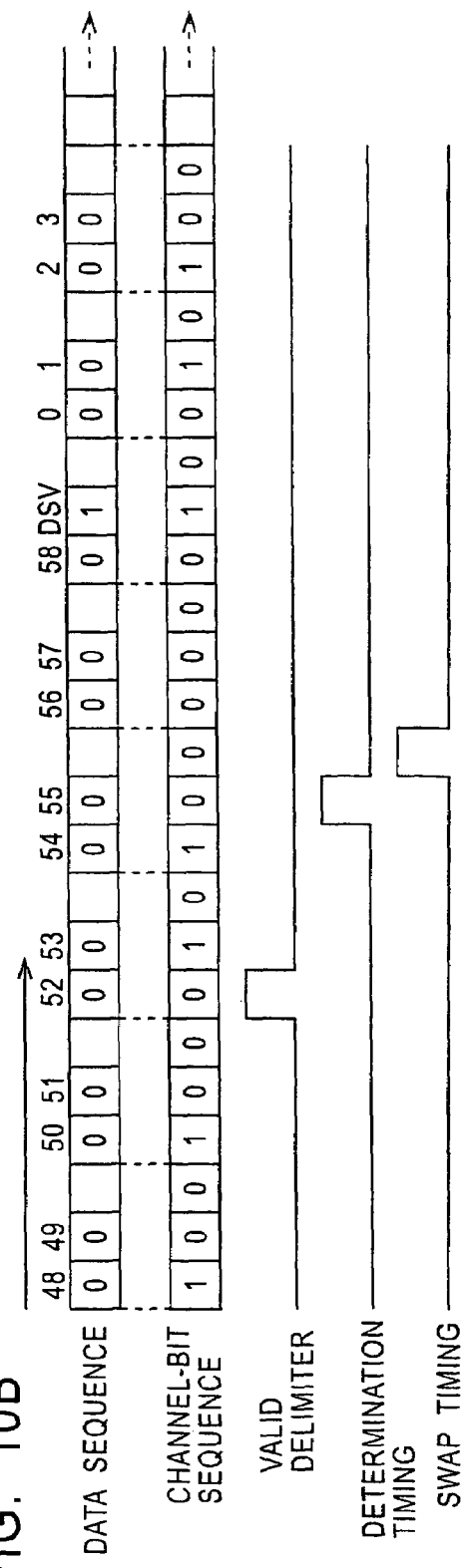

MODULATION APPARATUS AND METHOD, AND DSV-CONTROL-BIT GENERATING METHOD

This application is a continuation of U.S. application Ser. No. 10/471,675, which was the National Stage of International Application No, PCT/JP03/00501, filed on Jan. 22, 2003.

TECHNICAL FIELD

The present invention relates to modulation apparatuses and methods, and DSV-control-bit generating methods. Particularly, the present invention relates to a modulation apparatus and method and a DSV-control-bit generating method that are suitable for use in data transmission or recording of data on a recording medium.

BACKGROUND ART

When data is transmitted over a particular transmission path or recorded on a recording medium such as a magnetic disc, and optical disc, or a magneto-optical disc, the data is modulated in accordance with the transmission path or the recording medium.

A known method of such modulation is block coding. In block coding, a data sequence is divided into blocks of a unit consisting of m×i bits (hereinafter referred to as data words), and the data words are converted into codewords consisting of n×i bits according to an appropriate coding rule. The code is a fixed-length code if i=1, while the code is a variable-length code if a plurality of values can be selected as i, that is, if a particular i within a range of 1 to imax (a maximum i) is selected for conversion. The block codes are denoted as variable-length codes (d, k; m, n; r).

i is referred to as a constraint length, and imax is r (a maximum constraint length). d denotes a minimum number of successive "0"s between successive "1"s, for example, a minimum run of "0"s. k denotes a maximum number of successive "0"s between successive "1"s, for example, a maximum run of "0"s.

When a variable-length code obtained in the manner described above is recorded on an optical disc, a magneto-optical disc, or the like, for example, in the case of a compact disc or a mini disc, the variable-length code is NRZI (non return to zero inverted) modulated with "1" represented by inversion and "0" represented by no inversion, and recording is performed based on the NRZI-modulated variable-length code (hereinafter also referred to as a recording waveform sequence). In an earlier type of magneto-optical disc conforming to an ISO (International Organization for Standardization) standard, whose recording density is not so high, a bit sequence modulated for recording has been directly recorded without undergoing NRZI modulation.

Let a minimum inversion interval of a recording waveform sequence be denoted as Tmin and a maximum inversion interval thereof as Tmax. In order to allow recording at a high density in the direction of linear velocity, desirably, the minimum inversion interval Tmin is long; that is, the minimum run d is large. Furthermore, from the perspective of clock playback, desirably, the maximum inversion interval Tmax is short; that is, the maximum run k is small. Various modulation methods have been proposed in order to satisfy these conditions.

More specifically, modulation methods that have been proposed or that are actually used, for example, in optical discs, magnetic discs, magneto-optical discs, or the like, include RLL(1-7) (also denoted as (1, 7; m, n; r)) and RLL (2-7) (also denoted as (2, 7; m, n; r)), which are variable-length codes, and fixed-length RLL(1-7) (also denoted as (1, 7; m, n; 1)) that is used for MOs conforming to an ISO standard.

In disk apparatuses that are currently being developed for high-recording-density discs such as optical discs or magneto-optical discs, an RLL code (run length limited code) with a minimum run d=1 is often used.

A conversion table for the variable-length RLL(1-7) code is, for example, as follows:

TABLE 1

RLL(1. 7; 2. 3; 2)

| | Data | Code |
|---|---|---|
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |

The symbol x in the conversion table is considered as "1" if the subsequent channel bit is "0" and as "0" if the subsequent channel bit is "1". The maximum constraint length r is two.

Parameters of the variable-length RLL(1-7) is (1, 7; 2, 3; 2). Let a bit interval of a recording waveform sequence be denoted as T. Then, the minimum inversion interval Tmin expressed by (d+1)T is 2(=1+1)T. Let a bit interval of a data sequence be denoted as Tdata. Then, the minimum inversion interval Tmin expressed by (m/n)×2 is 1.33(= (⅔)×2)Tdata. Furthermore, the maximum inversion interval Tmax expressed by (k+1)T is 8(=7+1)T ((=(m/n)×8Tdata=(⅔)× 8Tdata=5.33Tdata). Furthermore, a detection-window width Tw is expressed by (m/n)×Tdata, and a value thereof is 0.67(=⅔)Tdata.

In channel-bit sequences obtained by the RLL(1-7) modulation in Table 1, 2T, which corresponds to Tmin, has a highest frequency of occurrence, followed by 3T and 4T. The rapid cycle of occurrence of edge information such as 2T and 3T is usually advantageous for clock playback.

However, as the recording density in the direction of linear velocity is further increased, conversely, Tmin becomes problematic. That is, when the minimum run 2T occurs successively, the recording waveform tends to be distorted. This is because the recording waveform is subject to the effect of noise, defocus, tangential tilt, etc. since the waveform output for 2T is smaller than other waveform outputs.

As described above, in recording at a high linear density, successive recording of Tmin (2T) is susceptible to external disturbance such as noise, and thus an error tends to occur during data playback. A pattern of error in data playback in this case is typically such that the edges between the beginning and the end of the successive occurrences of Tmin (2T) are all shifted to cause an error; that is, the length of bit errors generated is long.

When data is recorded on a recording medium or when data is transmitted, code modulation in accordance with the recording medium or a transmission path is executed. If the modulated codes include a DC component, fluctuation tends to arise in various error signals such as an error signal representing a tracking error in controlling a servo of a disc apparatus, or jitter tends to occur. Thus, it is desired that a DC component be minimized in the modulated codes.

Accordingly, controlling of a DSV (digital sum value) has been proposed. The DSV is a sum obtained by NRZI-modulating (i.e., level coding) a channel-bit sequence and adding up the codes of the bit sequence (data symbols) considering "1" as '+1' and "0" as '−1'. Minimizing the absolute value of the DSV indicating a DC component of the code sequence, i.e., controlling the DSV, serves to suppress the DC component of the code sequence.

In the modulated codes based on the variable-length RLL(1-7) table shown in Table 1 given earlier, DSV control is not executed. In such a case, DSV control is implemented by calculating DSVs at a predetermined interval in a modulated code sequence (channel-bit sequence) and inserting predetermined DSV controls bit into the code sequence (channel-bit sequence).

However, the DSV control bits are basically redundant bits. Thus, from the viewpoint of the efficiency of code conversion, the number of DSV control bits should be minimized.

Furthermore, it is desired that a minimum run d and a maximum run k do not change depending on DSV control bits that are inserted. This is because recording and playback characteristics are affected if (d, k) changes.

In actual RLL codes, however, although the minimum run must be complied with, the maximum run need not necessarily be complied with. In some formats, a pattern that does not comply with the maximum run is used as a synchronization signal. For example, although 8-16 code for DVDs (digital versatile discs) have a maximum run of 11T, 14T, which exceeds the maximum run, is used in a synchronization signal pattern to improve the detectability of the synchronization signal.

Thus, in the RLL(1-7) code, which exhibits a favorable conversion efficiency, in accordance with increase in density, it is important to control successive occurrences of the minimum run more suitably in accordance with a high linear density and to exercise DSV control as efficiently as possible.

For example, Japanese Unexamined Patent Application Publication No. 11-177431, filed earlier by the applicant of this application, discloses a modulation apparatus including DSV-control-bit inserting means for generating a first data sequence by inserting a first DSV control bit in a data sequence and for generating a second data sequence by inserting a second DSV control bit in the data sequence; modulation means for modulating both the first data sequence and the second data sequence using a conversion table such that the number of "1"s in an element of data sequences and the number of "1"s in a corresponding element of codeword sequences are coincidentally one or zero modulo two; and DSV calculating means for calculating a first segment DSV of the first data sequence having been modulated based on the conversion table and a second segment DSV of the second data sequence having been modulated based on the conversion table, and based on values obtained by adding these DSVs to an accumulated DSV, selecting and outputting one of the first data sequence and the second data sequence having been modulated based on the conversion table.

FIG. 1 is a block diagram showing an example configuration of a known modulation apparatus.

As shown in FIG. 1, a modulation apparatus 10 includes a DSV-control-bit inserting unit 11 for inserting "1" or "0" as DSV control bits at a predetermined interval.

In the DSV-control-bit inserting unit 11, a data sequence in which a DSV control bit "1" is to be inserted and a data sequence in which a DSV control bit "0" is to be inserted are prepared. Furthermore, the DSV-control-bit inserting unit 11 adjusts the positions of DSV segments so that the channel-bit sequence of each DSV segment is obtained by converting an input bit sequence including one DSV control bit.

A modulation unit 12 modulates the data sequences including DSV control bits that have been inserted by the DSV-control-bit inserting unit 11. A DSV control unit 13 NRZI-modulates the code sequences having been modulated by the modulation unit 12, thereby obtaining level data, then calculates DSVs, and finally outputs a recording code sequence for which DSV control has been exercised.

As another example, Japanese Unexamined Patent Application Publication No. 11-346154, filed earlier by the applicant of this application, discloses a conversion table having, as conversion codes, base codes with d=1, k=7, m= 2, and n=3, a conversion rule such that the number of "1"s in an element of data sequences modulo two and the number of "1"s in a corresponding codeword sequence modulo two are coincidentally one or zero, a first replacement code for restricting successive occurrences of the minimum run d within a predetermined number of times, and a second replacement code for complying with a run-length constraint.

FIG. 2 is a block diagram showing another example configuration of a known modulation apparatus.

As shown in FIG. 2, a modulation apparatus 20 includes a DSV-control-bit determining and inserting unit 21 for determining "1" or "0" as a DSV control bit and inserting it in an input data sequence at an arbitrary interval; a modulation unit 22 for modulating the data sequence including DSV control bits inserted; and an NRZI modulation unit 23 for converting an output of the modulation unit 22 into a recording waveform sequence. Furthermore, the modulation apparatus 20 includes a timing management unit 24 for generating a timing signal and supplying the timing signal to each component to exercise timing management.

However, when implementing DSV control by the method described above, specific control signals or the like must be devised.

For example, in the method described above, in order to prevent a channel-bit sequence from being generated by conversion including a next DSV control bit existing outside a relevant segment and to prevent an error in a segment DSV value calculated, processing for shifting DSV segments is executed. In order to implement such processing, control signals for controlling the operations of the components must be devised.

Furthermore, for example, in the method described above, a register used for calculating a segment DSV value holds all the values used for a previous calculation, sometimes causing an error in a segment DSV value calculated next due to unneeded values therein. Thus, in order to implement such processing, control signals for controlling the operations of the components and the components themselves must be devised.

DISCLOSURE OF INVENTION

The present invention has been made in view of the situation described above, and an object thereof is to achieve a more suitable DSV control by detecting a modulation delimiter and controlling a segment for calculating a segment DSV value.

A modulation apparatus according to the present invention comprises DSV-control-bit generating means for generating a DSV control bit that is inserted in an input bit sequence in order to control a DSV of a particular output code sequence; DSV-control-bit inserting means for inserting the DSV control bit generated by the DSV-control-bit generating means at a predetermined position of the input bit sequence; and first modulating means for modulating a post-insertion bit sequence obtained by inserting the DSV control bit into the input bit sequence, into the channel-bit sequence based on a conversion rule of a variable-length code (d, k; m, n; r); wherein the DSV-control-bit generating means comprises modulation-delimiter detecting means for detecting a modulation delimiter that serves as a delimiter for conversion of the variable-length code; and valid-delimiter detecting means for detecting a valid delimiter for controlling timing for determining a value of the DSV control bit, based on the modulation delimiter detected by the modulation-delimiter detecting means.

The modulation apparatus may further comprise NRZI modulating means for NRZI modulating the channel-bit sequence to generate the particular output code sequence.

The conversion rule may be such that the number of "1"s in one block of the input bit sequence or the post-insertion bit sequence modulo two coincides with the number of "1"s in a corresponding one block of the channel-bit sequence modulo two.

The conversion rule may be such that successive occurrences of a minimum run d in the channel-bit sequence is restricted within a predetermined number of times.

The conversion rule may have a minimum run=1, a maximum run k=7, a base data length before conversion m=2, and a base channel-bit length after conversion n=3.

In the modulation apparatus, the modulation apparatus may receive input of data having the base data length m within a period of outputting the channel-bit sequence having the base channel-bit length n.

The modulation-delimiter detecting means may detect one or two points of the modulation delimiter based on a pattern of the conversion rule, for a single codeword conversion based on the conversion rule with a constraint length r=4.

The DSV-control-bit generating means may further comprise first post-insertion-bit-sequence-candidate generating means for inserting a first candidate bit for the DSV control bit at the predetermined position of the input bit sequence to generate a first post-insertion-bit-sequence candidate from the input bit sequence; second post-insertion-bit-sequence-candidate generating means for inserting a second candidate bit for the DSV control bit at the predetermined position of the input bit sequence to generate a second post-insertion-bit-sequence candidate from the input bit sequence; second modulating means for modulating the first and second post-insertion-bit-sequence candidates based on a conversion rule that is the same as the conversion rule mentioned earlier; DSV calculating means for calculating DSV values based on first and second channel-bit-sequence candidates generated respectively by the second modulating means; and DSV-control-bit determining means for determining either the first or the second candidate bit as the DSV control bit based on the DSV values calculated by the DSV calculating means.

The DSV-control-bit determining means may determine the DSV control bit at a timing based on the valid delimiter detected by the valid-delimiter detecting means.

The DSV calculating means may comprise segment-DSV calculating means for calculating a segment DSV value of a current DSV control segment for each of the first and second channel-bit-sequence candidates; accumulated-DSV processing means for processing an accumulated DSV value based on a result of determination by the DSV-control-bit determining means; and an adder for adding the segment DSV value to the accumulated DSV value before the current DSV control segment to generate the DSV value.

Each of the first and second modulating means may comprise a minimum number of registers required for executing modulation based on the conversion rule.

Content of a predetermined register of the DSV-control-bit generating means may be matched with content of a register of a candidate determined when a DSV control bit has been determined by the DSV-control-bit determining means.

The timing based on the valid delimiter may be controlled so that an input bit sequence of a segment for calculating the segment DSV includes only one DSV control bit inserted at a predetermined position.

The modulation apparatus may further comprise first synchronization-signal inserting means for inserting a synchronization pattern including a preset unique pattern into the channel-bit sequence generated, wherein the DSV-control-bit generating means further comprises second synchronization-signal inserting means for inserting a pattern that is the same as the synchronization pattern into each of first and second channel-bit-sequence candidates obtained by modulation by the second modulating means, and providing the DSV calculating means with the first and second channel-bit-sequence candidates.

A modulation method according to the present invention comprises a DSV-control-bit generating step of generating a DSV control bit that is inserted in an input bit sequence in order to control a DSV of a particular output code sequence; a DSV-control-bit inserting step of inserting the DSV control bit generated in the DSV-control-bit generating step at a predetermined position of the input bit sequence; and a first modulating step of modulating a post-insertion bit sequence obtained by inserting the DSV control bit into the input bit sequence, into the channel-bit sequence based on a conversion rule of a variable-length code (d, k; m, n; r); wherein the DSV-control-bit generating step comprises a modulation-delimiter detecting step of detecting a modulation delimiter that serves as a delimiter for conversion of the variable-length code; and a valid-delimiter detecting step of detecting a valid delimiter for controlling timing for determining a value of the DSV control bit, based on the modulation delimiter detected in the modulation-delimiter detecting step.

A program of a first recording medium according to the present invention comprises a DSV-control-bit generating step of generating a DSV control bit that is inserted into an input bit sequence in order to control a DSV of a particular output code sequence; a DSV-control-bit inserting step of inserting the DSV control bit generated in the DSV-control-bit generating step at a predetermined position of the input bit sequence; and a first modulating step of modulating a post-insertion bit sequence obtained by inserting the DSV control bit into the input bit sequence, into the channel-bit sequence based on a conversion rule of a variable-length code (d, k; m, n; r); wherein the DSV-control-bit generating step comprises a modulation-delimiter detecting step of detecting a modulation delimiter that serves as a delimiter for conversion of the variable-length code; and a valid-delimiter detecting step of detecting a valid delimiter for controlling timing for determining a value of the DSV control bit, based on the modulation delimiter detected in the modulation-delimiter detecting step.

A first program allows a computer to execute a DSV-control-bit generating step of generating a DSV control bit that is inserted in an input bit sequence in order to control a DSV of a particular output code sequence; a DSV-control-bit inserting step of inserting the DSV control bit generated in the DSV-control-bit generating step at a predetermined position of the input bit sequence; and a first modulating step of modulating a post-insertion bit sequence obtained by inserting the DSV control bit into the input bit sequence, into the channel-bit sequence based on a conversion rule of a variable-length code (d, k; m, n; r); wherein the DSV-control-bit generating step comprises a modulation-delimiter detecting step of detecting a modulation delimiter that serves as a delimiter for conversion of the variable-length code; and a valid-delimiter detecting step of detecting a valid delimiter for controlling timing for determining a value of the DSV control bit, based on the modulation delimiter detected in the modulation-delimiter detecting step.

A DSV-control-bit generating method according to the present invention comprises a first post-insertion-bit-sequence-candidate generating step of inserting a first candidate bit for a DSV control bit at a predetermined position of an input bit sequence to generate a first post-insertion-bit-sequence candidate from the input bit sequence; a second post-insertion-bit-sequence-candidate generating step of inserting a second candidate bit for the DSV control bit at the predetermined position of the input bit sequence to generate a second post-insertion-bit-sequence candidate from the input bit sequence; a second modulating step of modulating the first and second post-insertion-bit-sequence candidates based on a conversion rule of a variable-length code (d, k; m, n; r); a modulation-delimiter detecting step of detecting a modulation delimiter that serves as a delimiter for conversion of the variable-length code in the second modulating step; a valid-delimiter detecting step of detecting a valid delimiter for controlling timing fro determining a value of the DSV control bit, based on the modulation delimiter detected in the modulation-delimiter detecting step; a DSV calculating step of calculating DSV values based on first and second channel-bit-sequence candidates generated respectively in the second modulating step; and a DSV-control-bit determining step of determining either the first or the second candidate bit as the DSV control bit based on the DSV values calculated in the DSV calculating step, at the timing based on the valid delimiter detected in the valid-delimiter detecting step.

A program of a second recording medium according to the present invention comprises a first post-insertion-bit-sequence-candidate generating step of inserting a first candidate bit for a DSV control bit at a predetermined position of an input bit sequence to generate a first post-insertion-bit-sequence candidate from the input bit sequence; a second post-insertion-bit-sequence-candidate generating step of inserting a second candidate bit for the DSV control bit at the predetermined position of the input bit sequence to generate a second post-insertion-bit-sequence candidate from the input bit sequence; a second modulating step of modulating the first and second post-insertion-bit-sequence candidates based on a conversion rule of a variable-length code (d, k; m, n; r); a modulation-delimiter detecting step of detecting a modulation delimiter that serves as a delimiter for conversion of the variable-length code in the second modulating step; a valid-delimiter detecting step of detecting a valid delimiter for controlling timing fro determining a value of the DSV control bit, based on the modulation delimiter detected in the modulation-delimiter detecting step; a DSV calculating step of calculating DSV values based on first and second channel-bit-sequence candidates generated respectively in the second modulating step; and a DSV-control-bit determining step of determining either the first or the second candidate bit as the DSV control bit based on the DSV values calculated in the DSV calculating step, at the timing based on the valid delimiter detected in the valid-delimiter detecting step.

A second program according to the present invention allows a computer to execute a first post-insertion-bit-sequence-candidate generating step of inserting a first candidate bit for a DSV control bit at a predetermined position of an input bit sequence to generate a first post-insertion-bit-sequence candidate from the input bit sequence; a second post-insertion-bit-sequence-candidate generating step of inserting a second candidate bit for the DSV control bit at the predetermined position of the input bit sequence to generate a second post-insertion-bit-sequence candidate from the input bit sequence; a second modulating step of modulating the first and second post-insertion-bit-sequence candidates based on a conversion rule of a variable-length code (d, k; m, n; r); a modulation-delimiter detecting step of detecting a modulation delimiter that serves as a delimiter for conversion of the variable-length code in the second modulating step; a valid-delimiter detecting step of detecting a valid delimiter for controlling timing fro determining a value of the DSV control bit, based on the modulation delimiter detected in the modulation-delimiter detecting step; a DSV calculating step of calculating DSV values based on first and second channel-bit-sequence candidates generated respectively in the second modulating step; and a DSV-control-bit determining step of determining either the first or the second candidate bit as the DSV control bit based on the DSV values calculated in the DSV calculating step, at the timing based on the valid delimiter detected in the valid-delimiter detecting step.

According to the modulation apparatuses and methods, DSV-control-bit generating method, and programs, a DSV control bit having a value determined is inserted at a predetermined position of an input data sequence, the input data sequence is converted into a codeword sequence based on a conversion table, a modulation delimiter that serves as a delimiter for variable-length codeword conversion based on the conversion table is detected, timing for determining a value of the DSV control bit is controlled, and the value of the relevant DSV control bit is determined.

BRIEF DESCRIPTION OF THE DRAWINGS

FIG. 7 is a diagram showing a specific example of how a 1-7 PP data conversion unit sets a flag at a modulation-delimiter position.

FIG. 8A is a diagram showing how a modulation-delimiter detecting unit detects a modulation delimiter.

FIG. 8B is a diagram showing how a modulation-delimiter detecting unit detects a modulation delimiter.

FIG. 10A is a diagram showing how a DSV-control-bit determining unit determines a swap timing.

FIG. 10B is a diagram showing how a DSV-control-bit determining unit determines a swap timing.

BEST MODE FOR CARRYING OUT THE INVENTION

Figure 1:
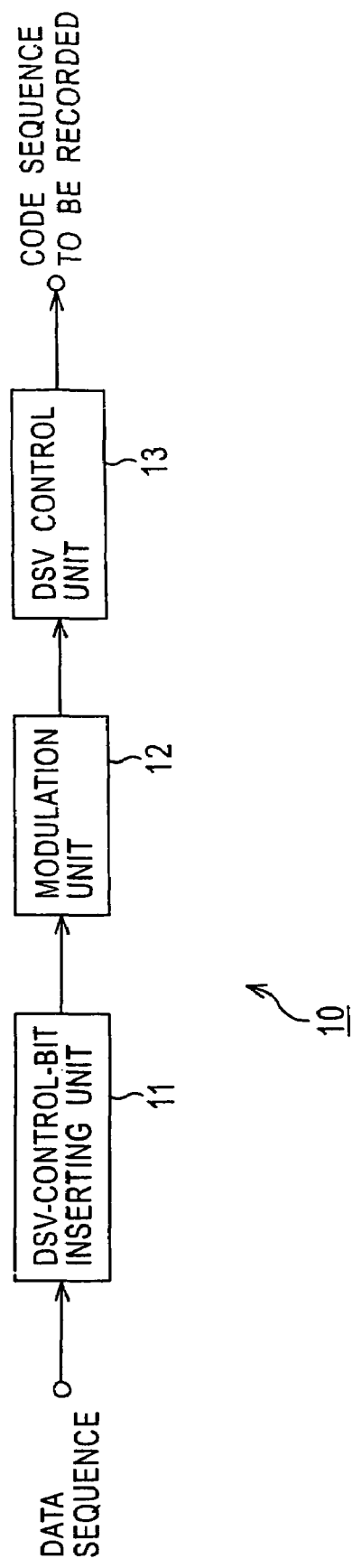
FIG. 1 is a block diagram showing an example configuration of a known modulation apparatus.
Figure 2:
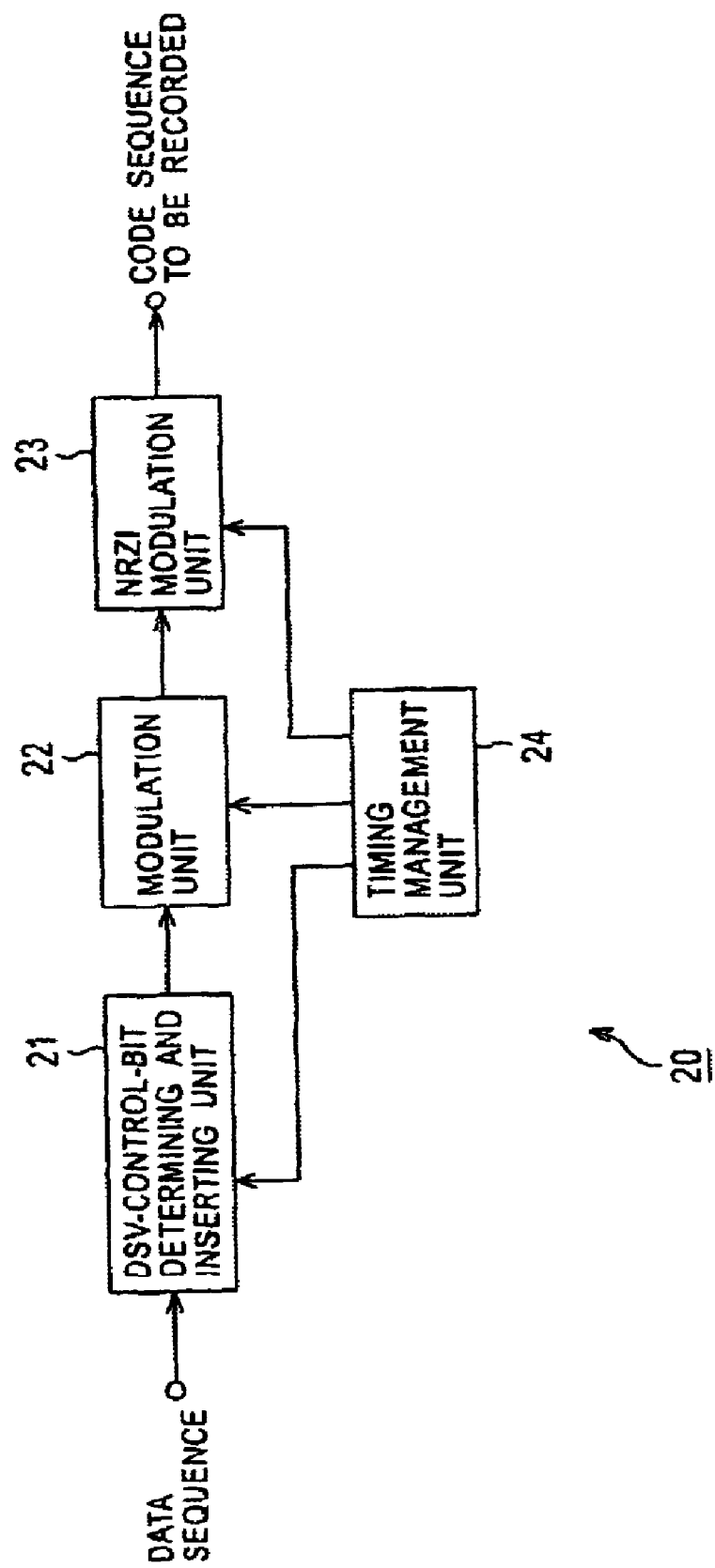
FIG. 2 is a block diagram showing another example configuration of a known modulation apparatus.

Now, an embodiment of the present invention will be described. Hereinafter, for convenience of description, a sequence of '0's and '1's of data before conversion (a data sequence before conversion) will be expressed in ( ), such as (000011), and a sequence of '0's and '1's of a code after conversion (a codeword sequence) will be expressed in such as "000100100". Table 2 given below is an example of a conversion table for converting data into codes according to the present invention.

TABLE 2

1, 7PP_table
(d, k; m, n; r) = (1, 7; 2, 3; 4)

| Data | Code | | | |
|---|---|---|---|---|
| 11 | *0* (Before 0:* = 1, Before 1:* = 0) | | | |
| 10 | 001 | | | |
| 01 | 010 | | | |
| 0011 | | | 010 | 100 |
| 0010 | | | 010 | 000 |
| 0001 | | | 000 | 100 |
| 000011 | | 000 | 100 | 100 |
| 000001 | | 010 | 100 | 100 |
| 00001000 | 000 | 100 | 100 | 100 |
| 00001001 | 000 | 100 | 000 | 010 |
| 00001010 | 000 | 100 | 000 | 001 |
| 00001011 | 000 | 100 | 000 | 101 |
| 00000000 | 010 | 100 | 100 | 100 |
| 00000001 | 010 | 100 | 000 | 010 |
| 00000010 | 010 | 100 | 000 | 001 |
| 00000011 | 010 | 100 | 000 | 101 |
| #110111-01 | : | | | |
| 001 | :101 010 101→001 000 000 | | | |
| 00000 | :000 010 101 (cbit replace) | | | |
| 0000t | : | | | |
| Termination table | | | | |
| 00 | | | | 000 |
| 0000 | | | 010 | 100 |
| 000010 | 000 | | 100 | 000 |
| 000000 | 010 | | 000 | 000 |

The conversion table shown in Table 2 has a minimum run d=1, a maximum run k=7, and a conversion ratio of data to corresponding channel bits m: n=2:3. The table is a variable-length table with a maximum constraint length r=4. The conversion table includes, as conversion codes, base codes (codes for the data sequences (11) to (00000011)) that are necessary for conversion, replacement codes (codes for the data sequence (110111)) that are not necessary for conversion but that allows more efficient conversion, and a termination table including terminal codes (codes for data sequences (00), (0000), (000010), and (000000)) for terminating a code at an arbitrary position. Furthermore, a synchronization signal is defined in the conversion table.

Furthermore, in Table 2, an indeterminate code (a code including*) is included in an element of base codes. The indeterminate code is determined as "0" or "1" so as to comply with the minimum run d and the maximum run k, regardless of the codeword sequence immediately before and after the indeterminate code. That is, in Table 2, if a two-bit data sequence before conversion is (11), "000" or "101" is selected depending on a codeword sequence immediately before the data sequence, and the data sequence is converted accordingly. That is, if one channel bit of the immediately preceding codeword sequence is "1", the two-bit data (11) is converted into a codeword "000" in order to comply with the minimum run d. On the other hand, if one channel bit of the immediately preceding codeword sequence is "0", the data sequence is converted into a codeword "101" in order to comply with the maximum run k.

$

Furthermore, the conversion table shown in Table 2 includes replacement codes for restricting successive occurrences of the minimum run. If a data sequence (110111) is immediately followed by a data sequence (01), (001), or (00000), or if a data sequence (110111) is immediately followed by a data sequence (0000) and is thereby terminated, the data sequence (110111) is replaced by a codeword "001000000". If the immediately following data sequence is none of the data sequences given above, the data sequence (110111) is encoded by the unit of two bits ((11), (01), (11)), and is thereby converted into a codeword sequence "101010101" or "000010101".

Furthermore, the conversion codes in Table 2 have a conversion rule such that the number of '1's in an element of data sequences modulo two and the number of '1's in a corresponding element of codeword sequences modulo two are coincidently one or zero (The corresponding elements both have an odd number of '1's or an even number of '1's). For example, of the conversion codes, an element (000001) of data sequences corresponds to an element "010100100" of codeword sequences. The numbers of '1's in the respective elements are one for the data sequence and three for the corresponding codeword sequence, and both are coincidentally one modulo two (odd numbers). Similarly, of the conversion codes, an element (00000000) of data sequences corresponds to an element "010100100100" of codeword sequences. The numbers of '1's in the respective elements are zero for the data sequence and four for the corresponding codeword sequence, and both are coincidently zero modulo two (even numbers).

Figure 3:
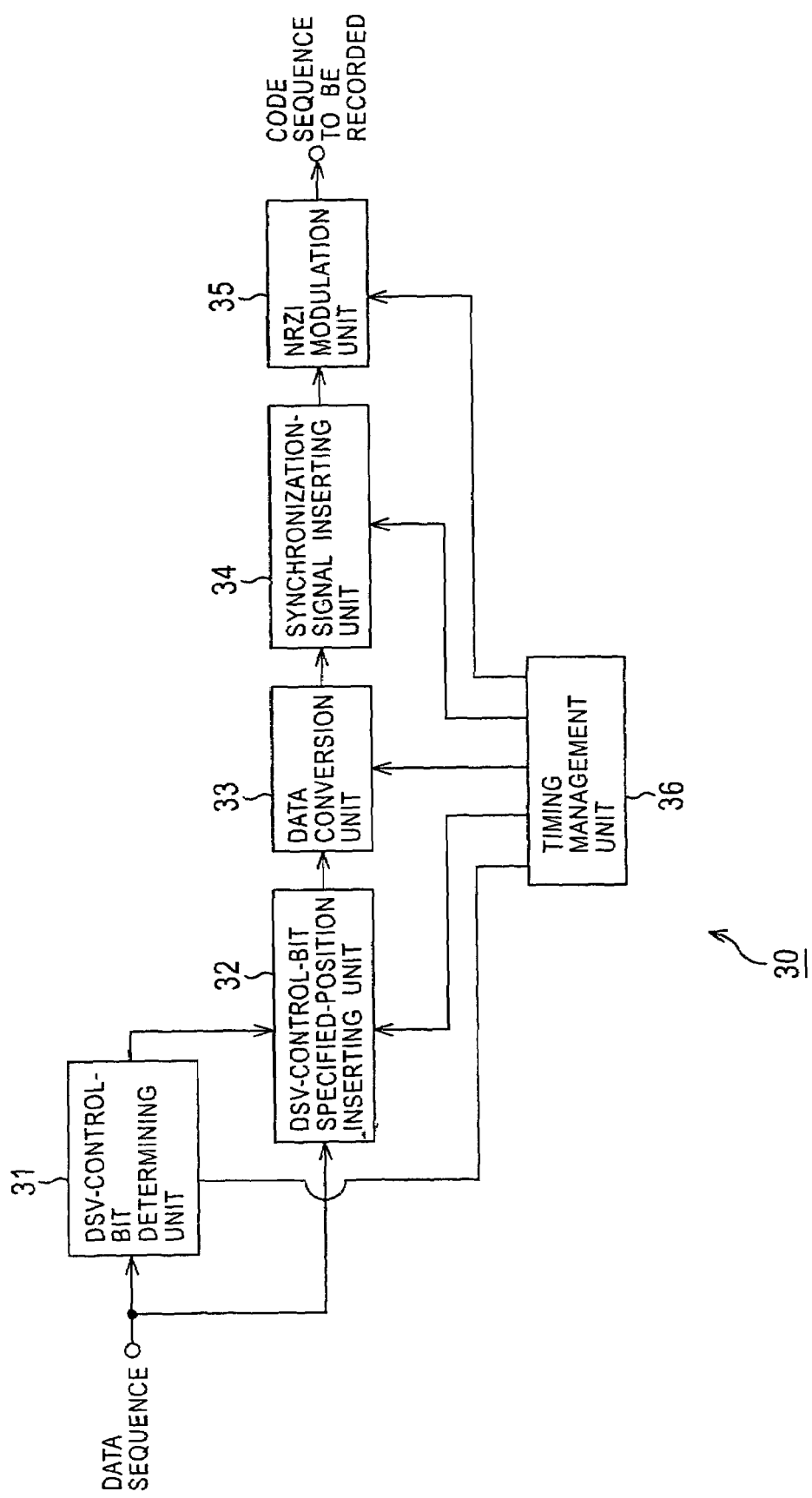
FIG. 3 is a block diagram showing an example configuration of a modulation apparatus according to the present invention.

Referring next to FIG. 3, a modulation apparatus according to an embodiment of the present invention will be described with reference to the figure. In this embodiment, a data sequence is converted into a variable-length code (d, k; m, n; r)=(1, 7; 2, 3; 4) according to Table 2.

As shown in FIG. 3, a modulation apparatus 30 includes a DSV-control-bit determining unit 31 for determining '1' or '0', based on an input data sequence, as a DSV control bit to be inserted into the data sequence; a DSV-control-bit specified-position inserting unit 32 for inserting the DSV control bit having the value determined into the input data sequence at an appropriate timing; a data conversion unit 33 for converting the data sequence, including the DSV control bit determined into channel bits based on a predetermined conversion table; a synchronization-signal inserting unit 34 for inserting a predetermined synchronization signal at a predetermined position of the channel bit sequence supplied from the data conversion unit 33; and an NRZI modulation unit 35 for converting an output of the synchronization-signal inserting unit 34 into a recording waveform sequence or a transmission code sequence. Furthermore, the modulation apparatus 30 includes a timing management unit 36 for generating a timing signal and supplying the timing signal to the DSV-control-bit determining unit 31, the DSV-control-bit specified-position inserting unit 32, the data conversion unit 33, the synchronization-signal inserting unit 34, and the NRZI modulation unit 35, thereby exercising timing management.

The timing of processing by the DSV-control-bit specified-position inserting unit 32 has been described with reference to FIG. 3 as managed by the timing management unit 36. However, without limitation to the arrangement described above, for example, the DSV-control-bit specified-position inserting unit 32 may further has the function of adjusting timing of transmission of an input bit sequence, allowing a DSV control bit supplied from the DSV-control-bit determining unit 31 to be inserted at a predetermined position of the input bit sequence whose timing of transmission has been adjusted.

Figure 4:
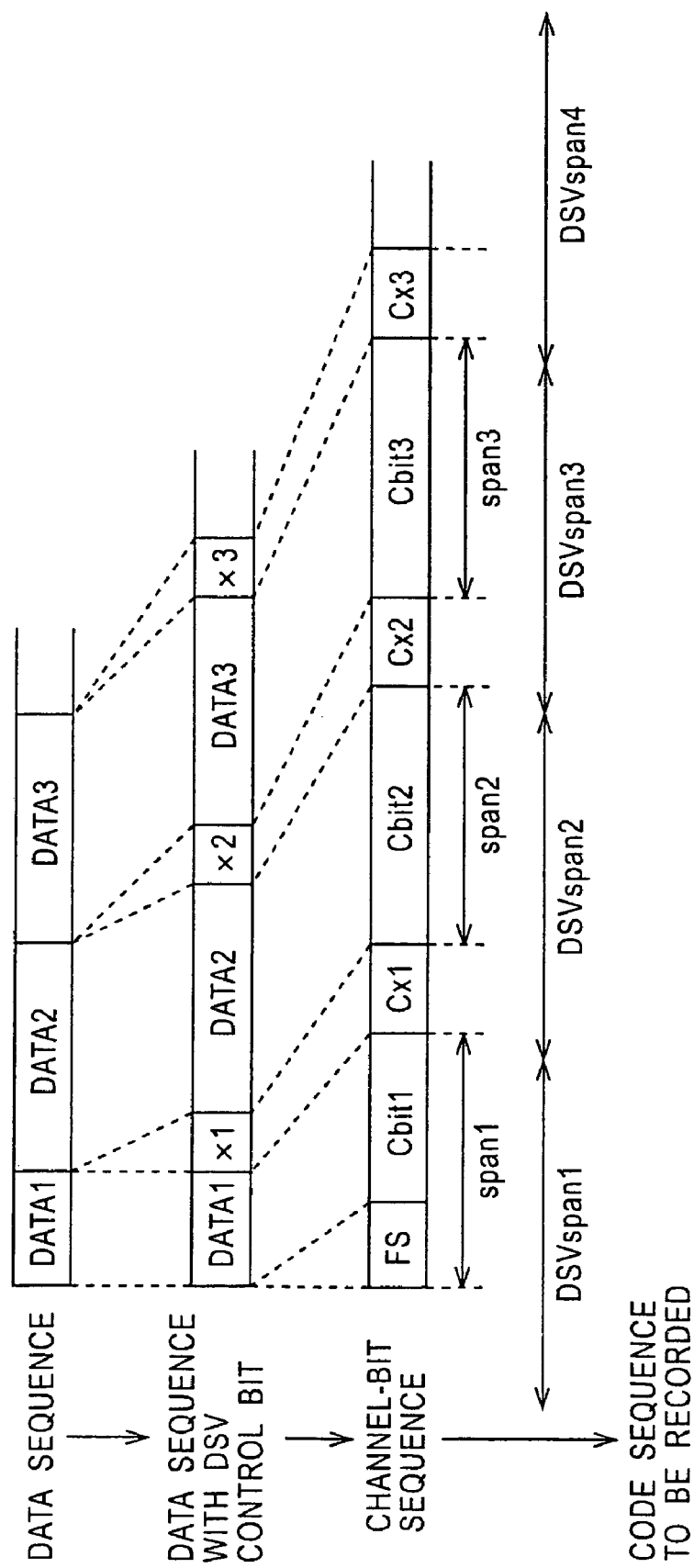
FIG. 4 is a diagram for explaining processing executed by the modulation apparatus shown in FIG. 3.

FIG. 4 is a diagram for explaining processing executed by the modulation apparatus 30 shown in FIG. 3. A data sequence includes information data such as an ECC (error correcting code) in addition to user data. The DSV-control-bit specified-position inserting unit 32, based on determination by the DSV-control-bit determining unit 31, inserts DSV control bits x1, x2, and x3 in the data sequence at a cycle of DSV segments constituting DSV calculation intervals at arbitrary intervals. In FIG. 4, DSV segments correspond to DATA1, DATA2, and DATA3 having arbitrary lengths.

In DATA1, a frame synchronization signal (hereinafter referred to as FS (frame sync)) for establishing synchronization between frames is inserted. Thus, DATA1, i.e., a DSV segment that serves as an interval of insertion of a DSV control bit, is set to be short.

That is, the length of DATA1 is determined so that span1 representing the length of a DSV segment of a channel-bit sequence including channel bits Cbit1 corresponding to DATA1, span2 representing the length of a DSV segment of a channel-bit sequence including channel bits Cbit2 corresponding to DATA2, and span3 representing the length of a DSV segment of a channel-bit sequence including channel bits Cbit3 corresponding to DAT43 will all be the same (span1=span2=span3).

Thus, if the FS inserted has FS (bits) and DATA2 and DATA3 both have x (bits), since the conversion ratio of the conversion table is m: n=2:3, DATA1 has x−FS*2/3 (bits). The DSV control bits each become longer in accordance with the conversion ratio by the conversion into channel-bit sequences; that is, x1 is converted into Cx1, x2 is converted into Cx2, and x3 is converted into Cx3.

In order to accurately control the values of DSV control bits inserted, as will be described later, segments DSVspan1, DSVspan2, and DSVspan3 are segmented ahead of positions where DSV control bits are actually inserted. At this time, only one DSV control bit is inserted in each of the segments.

As described above, a channel bit sequence (a recording code sequence or a transmission code sequence after NRZI modulation), after insertion of FS, includes DSV control bits inserted at a regular interval, whereby DSV control is exercised.

Figure 5:
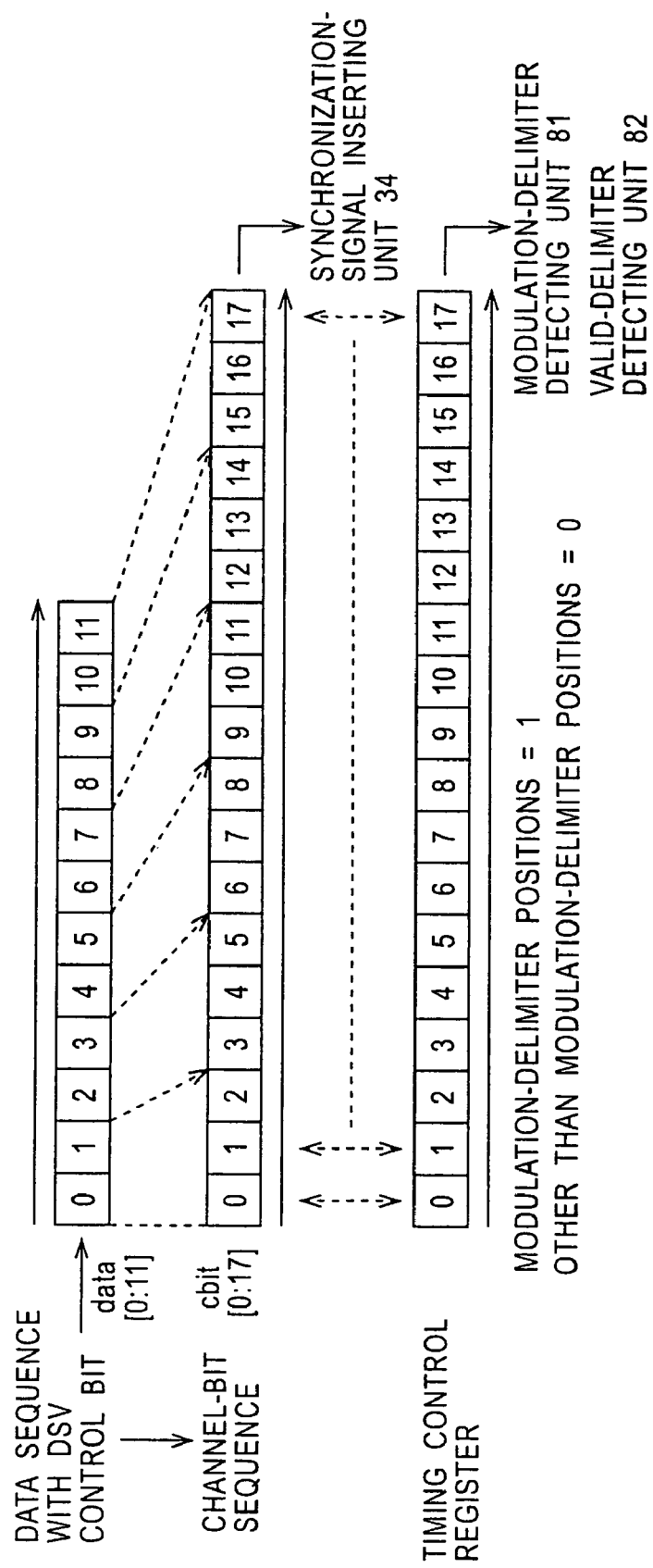
FIG. 5 is a schematic diagram showing the configuration of registers during conversion of an input data sequence to a channel-bit sequence.

FIG. 5 is a schematic diagram showing the configuration of registers during conversion of an input data sequence into a channel-bit sequence. FIG. 5 shows the configuration of registers that are at least required when converting a data sequence into a channel-bit sequence based on Table 2 given earlier. The registers include 12 bits of data[0:11] for storing a data sequence including a DSV control bit inserted before conversion, and 18 bits of cbit[0:17] for storing a channel-bit sequence after conversion by the data conversion unit 33. Furthermore, a timing register, etc. is provided.

Figure 6:
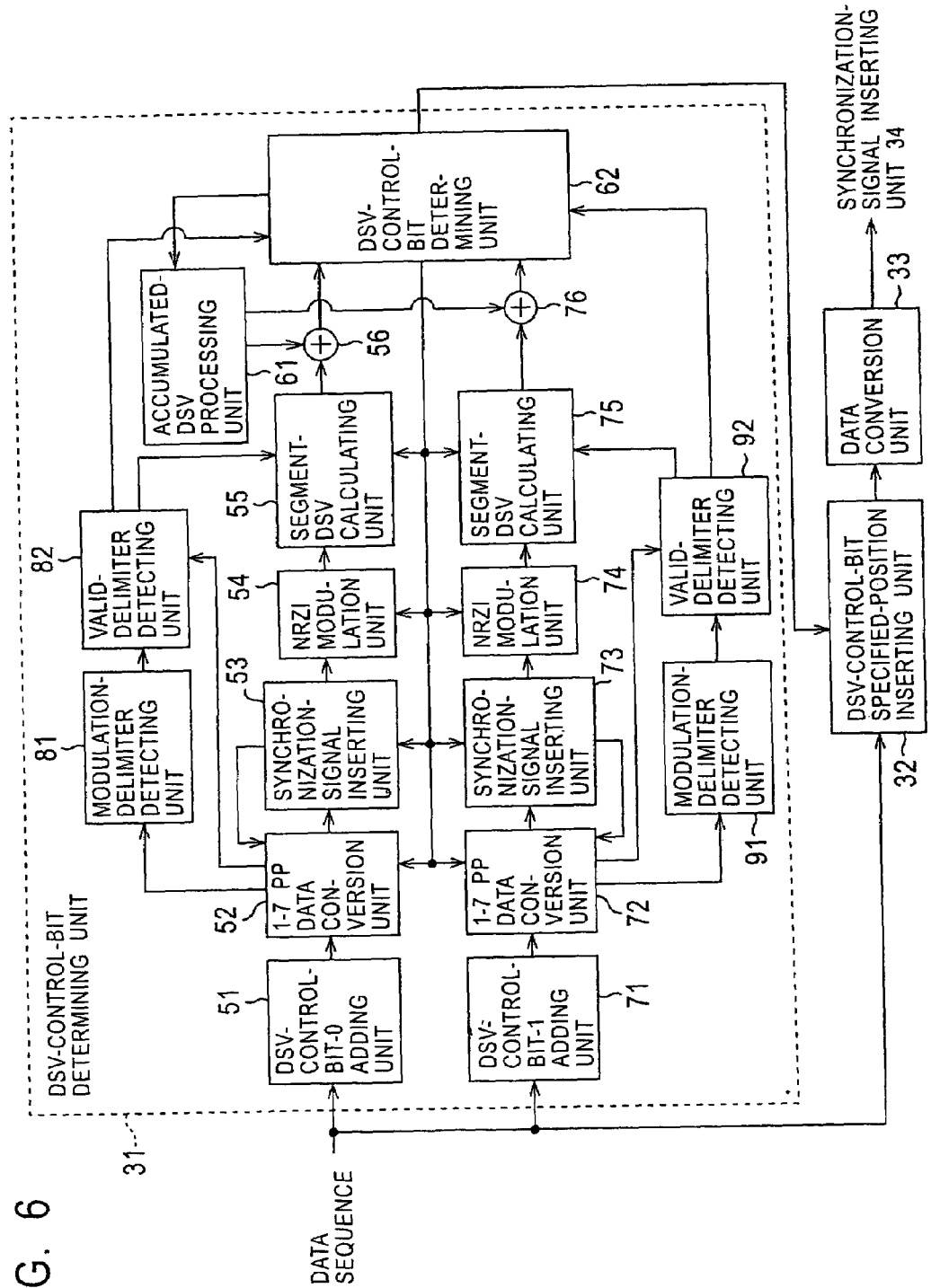
FIG. 6 is a block diagram showing a detailed example configuration of a DSV-control-bit determining unit 31 of the modulation apparatus.

FIG. 6 is a block diagram showing a specific example configuration of the DSV-control-bit determining unit 31 of the modulation apparatus 30. Referring to FIG. 6, a data sequence is supplied to the DSV-control-bit determining unit 31 and the DSV-control-bit specified-position inserting unit 32.

The DSV-control-bit determining unit 31 performs data conversion and DSV calculation in two lines. A line for processing a data sequence with a DSV control bit having a value of '0' and a line for processing a data sequence with a DSV control bit having a value of '1' operate independently of each other. That is, the data sequence supplied to the DSV-control-bit determining unit 31 is supplied to a DSV-control-bit-0 adding unit 51 for adding a DSV control bit with a value of '0' to the input data sequence at a predetermined interval, and to a DSV-control-bit-1 adding unit 71 for adding a DSV control bit with a value of '1' to the input data sequence at a predetermined interval.

The data sequence with the DSV control bit having the value of '0' added thereto by the DSV-control-bit-0 adding unit 51 is supplied to a 1-7 PP data conversion unit 52. The 1-7 PP data conversion unit 52 converts the data sequence with the DSV control bit added thereto into a channel-bit sequence based on the conversion table shown in Table 2, having parameters of (d, k; m, n; r)=(1, 7; 2, 3; 4), and supplies the channel-bit sequence to a synchronization-signal inserting unit 53.

The synchronization-signal inserting unit 53 inserts a synchronization signal including a unique pattern that does not exist as a conversion code of the conversion table, at a predetermined position of the channel-bit sequence supplied from the 1-7 PP conversion unit 52, and supplies the result to an NRZI modulation unit 54.

In order to allow the synchronization-signal inserting unit 53 to insert the synchronization signal into the channel bit sequence, the 1-7 PP data conversion unit 52 terminates conversion at an arbitrary position of the data sequence based on the termination table shown in Table 2. The synchronization-signal inserting unit 53 inserts the synchronization signal subsequently to the terminating position of the channel-bit sequence.

The synchronization-signal inserting unit 53, having inserted the synchronization signal in the channel-bit sequence, supplies information of the last bit of the synchronization signal to the 1-7 PP data conversion unit 52. The 1-7 PP data conversion unit, as required, refers to the information of the last bit of the synchronization signal to convert the data sequence based on the conversion table shown in Table 2.

The NRZI modulation unit 54 NRZI-modulates the channel bit sequence including the synchronization signal, supplied from the synchronization-signal inserting unit 53, and supplies the result to a segment-DSV calculating unit 55.

The segment-DSV calculating unit 55 calculates a segment DSV value determined by DSV values in a particular DSV segment from the NRZI-modulated channel-bit sequence. In the calculation, the DSV value is considered to be '+1' if the value of an NRZI-modulated channel bit is '1' and to be '−1' if the value is '0'. The segment DSV value calculated is supplied to an adder 56.

The adder 56 adds an accumulated DSV value supplied from an accumulated-DSV processing unit 61 to the segment DSV value supplied from the segment-DSV calculating unit 55, as will be described later, and supplies the resulting new accumulated DSV value to the DSV-control-bit determining unit.

The accumulated DSV processing unit 61 stores in advance an accumulated DSV value obtained by adding or subtracting all the segment-DSV values that have been calculated. The accumulated-DSV processing unit 61 supplies the accumulated DSV value stored therein to the adder 56 at a predetermined timing.

The 1-7 PP data conversion unit 52 supplies, to a modulation-delimiter detecting unit 81, modulation-delimiter information for the data sequence including the DSV control bits, including information regarding modulation delimiters based on the conversion table shown in Table 2. Furthermore, the 1-7 PP data conversion unit 52 supplies, to a valid-delimiter detecting unit 82, a DSV-segment-delimiter signal for the data sequence including the DSV control bits, including information regarding delimiter positions of DSV segments.

The modulation-delimiter detecting unit 81 detects modulation-delimiter positions based on the modulation-delimiter information supplied thereto. The modulation-delimiter detecting unit 81, having detected the modulation-delimiter positions, supplies a modulation-delimiter signal including information regarding the modulation-delimiter positions to the valid-delimiter detecting unit 82.

The valid-delimiter detecting unit 82, based on the DSV-segment-delimiter signal representing the delimiter position of the DSV segment, supplied from the 1-7 PP data conversion unit 52, detects a valid-delimiter position for controlling the timing of determination of a DSV control bit of the relevant DSV segment from the modulation-delimiter positions represented by the modulation-delimiter signal supplied from the modulation-delimiter detecting unit 81, and supplies a valid-delimiter signal representing the valid-delimiter position to the segment-DSV calculating unit 55 and the DSV-control bit determining unit 62.

The system for inserting DSV control bits having a value of '0' in an input data sequence is configured as described above. Also, the system for inserting DSV control bits having a value of '1' is similarly configured. That is, a DSV-control-bit-1 adding unit 71 corresponds to the DSV-control-bit-0 adding unit 51, a 1-7 PP data conversion unit 72 corresponds to the 1-7 PP data conversion unit 52, a synchronization-signal inserting unit 73 corresponds to the synchronization-signal inserting unit 53, an NRZI modulation unit 74 corresponds to the NRZI modulation unit 54, a segment-DSV calculating unit 75 corresponds to the segment-DSV calculating unit 55, an adder 76 corresponds to the adder 56, a modulation-delimiter detecting unit 91 corresponds to the modulation-delimiter detecting unit 81, and a valid-delimiter detecting unit 92 corresponds to the valid-delimiter detecting unit 82, and the components executes basically the same processing, respectively.

The DSV-control-bit determining unit 62 receives, from the adder 56, an accumulated DSV value that is based on the data sequence including DSV control bits having the value of '0', and also receives, from the adder 76, an accumulated DSV value that is based on the data sequence including the DSV control bits having the value of '1'. The DSV-control-bit determining unit 62, based on these two accumulated DSV values, determines a value of DSV control bit to be inserted in the data sequence. That is, the DSV-control-bit determining unit 62 selects one with a smaller absolute value of the two.

The accumulated DSV value determined by the DSV-control-bit determining unit 62 as the value of the DSV control bit to be inserted in the data sequence is supplied to the accumulated-DSV processing unit 61. The accumulated-DSV processing unit 61, based on the DSV value supplied thereto, updates an accumulated DSV value stored therein.

The DSV-control-bit determining unit 62, having determined the value of the DSV control bit to be inserted into the data sequence, supplies the result of determination to the DSV-control-bit specified-position inserting unit 32. The DSV-control-bit specified-position inserting unit 32, based on the result of determination supplied from the DSV-control-bit determining unit 62, inserts the DSV control bit at a predetermined position of the data sequence, and supplies the result to the data conversion unit 33.

Furthermore, the DSV-control-bit determining unit 62 supplies information identifying which has been determined as the value of the DSV control bit to be inserted into the data sequence to the 1-7 PP data conversion unit 52, the synchronization-signal inserting unit 53, the NRZI modulation unit 54, the segment-DSV calculating unit 55, the 1-7 PP data conversion unit 72, the synchronization-signal inserting unit 73, the NRZI modulation unit 74, and the segment-DSV calculating unit 75, and updates, as required, the content of registers referred to by the components.

That is, the values of the registers referred to by the components of the line associated with the determined value of the DSV control bit to be inserted into the data sequence are correspondingly stored as values of registers referred to by the components of the opposite line. Consequently, the content of the registers referred to by the line for adding DSV control bits with a value of '0' and the content of the registers referred to by the line for adding DSV control bits with a value of '1' are matched with each other using the values of the registers referred to by the line associated with the selected value of the DSV control bit.

The DSV-control-bit determining unit 31 for determining a value of a DSV control bit to be inserted into the data sequence is configured as described above.

Next, the operation of this embodiment will be described.

First, an input data sequence is supplied to the DSV-control-bit-0 adding unit 51 and the DSV-control-bit-1 adding unit 71 of the DSV-control-bit determining unit 31 and to the DSV-control-bit specified-position inserting unit 32.

The DSV-control-bit-0 adding unit 51, having received the data sequence, adds a DSV control bit having a value of '0' to the data sequence at a predetermined interval. The 1-7 PP data conversion unit 52 obtains the data sequence including the DSV control bits having the value of '0', added by the DSV-control-bit-0 adding unit 51, and converts the data sequence into a channel-bit sequence composed of codewords based on the conversion table shown in Table 2.

The 1-7 PP data conversion unit 52, as required, refers to the information regarding the last bit of the synchronization signal supplied from the synchronization-signal inserting unit 53 to convert the data sequence into a channel-bit sequence. The channel-bit sequence obtained by the conversion is supplied to the synchronization-signal inserting unit 53. Furthermore, the 1-7 PP data conversion unit 52, when modulating data, supplies modulation-delimiter-position information in which a flag is set at a modulation-delimiter position to the modulation-delimiter-position detecting unit 81, and supplies a DSV-segment-delimiter signal to the valid-delimiter detecting unit 82.

The synchronization-signal inserting unit 53, having received the channel-bit sequence obtained by the conversion, inserts a synchronization signal having a predetermined pattern at a predetermined position of the channel-bit sequence, and supplies the result to the NRZI modulation unit 54. Furthermore, the synchronization-signal inserting unit 53 supplies the information regarding the last bit of the synchronization signal to the 1-7 PP data conversion unit 52 so that the 1-7 PP data conversion unit 52 can refer to the value of the last bit of the immediately preceding channel-bit sequence during data modulation.

Then, the NRZI modulation unit 54 NRZI-modulates the channel-bit sequence including the synchronization signal inserted by the synchronization-signal inserting unit 53, and supplies the result to the segment-DSV calculating unit 55.

The modulation-delimiter detecting unit 81, having received the modulation-delimiter-position information from the 1-7 PP data conversion unit 52, detects modulation-delimiter positions, generates a modulation-delimiter-position signal, and supplies the modulation-delimiter position signal to the valid-delimiter detecting unit 82.

On the other hand, the DSV-control-bit-1 adding unit 71, having received a data sequence, adds DSV control bits having a value of '1' to the data sequence at a predetermined interval. The 1-7 PP data conversion unit 72, similarly to the 1-7 PP data conversion unit 52, converts the data sequence including the DSV control bits added thereto into a channel-bit sequence.

Furthermore, the 1-7 PP data conversion unit 72, as required, refers to the information regarding the last bit of the synchronization signal supplied from the synchronization-signal inserting unit 73 to convert the data sequence into a channel-bit sequence. The channel-bit sequence obtained by the conversion is supplied to the synchronization-signal inserting unit 73. Furthermore, the 1-7 PP data conversion unit 72 supplies modulation-delimiter-position information to the modulation-delimiter-position detecting unit 91, and supplies a DSV-segment-delimiter signal to the valid-delimiter detecting unit 92.

The synchronization-signal inserting unit 73 inserts a synchronization signal, and supplies the result to the NRZI modulation unit 74. Furthermore, the synchronization-signal inserting unit 73 supplies information regarding the value of the last bit of the synchronization signal to the 1-7 PP data conversion unit 72. Then, the NRZI modulation unit 74 NRZI-modulates the channel-bit sequence including the synchronization signal inserted by the synchronization-signal inserting unit 73, and supplies the result to the segment-DSV calculating unit 75.

The modulation-delimiter detecting unit 91, having received the modulation-delimiter-position information from the 1-7 PP data conversion unit 72, detects modulation-delimiter positions, generates a modulation-delimiter-position signal, and supplies the modulation-delimiter-position signal to the valid-delimiter detecting unit 92.

FIG. 7 is a diagram showing a specific example of how a 1-7 PP data conversion unit sets a flag at a modulation-delimiter position.

Referring to FIG. 7, a data sequence with a control bit is sequentially input to 12 bits of data[0:11] from data[0], and is shifted clock by clock toward the larger register number. Data that has been shifted to data[0:11] is discarded at the time of a next shift. The relationship between the data sequence and a corresponding channel-bit sequence is shown in FIG. 5.

Although not shown in FIG. 5, a register for controlling timing, such as a register indicating modulation-delimiter positions, is configured so as to allow the same number of data to be stored as the register for storing a channel-bit sequence, and the positions of these registers correspond to each other. In the register for timing control, for example, "1" is stored for active, and '0' is stored at the other positions.

A data sequence is processed by the unit of two data. If data [0, 1]=[1, 1], data [0, 1]=[0, 1], or data [0, 1]=[1, 0], the 1-7 PP data conversion unit 52, having detected (11), (10), or (01), determines a conversion pattern based on the conversion table shown in Table 2, as described earlier. Then, a channel-bit sequence obtained by the conversion is stored in cbit[0, 1, 2]. At this time, 1 is stored in a register representing a modulation-delimiter position corresponding to cbit[2].

If data [0, 1]=[0, 0], a conversion pattern is not determined with a constraint length r=1, so that a new data sequence is sequentially input. When two data have been newly input (four data in total), the 1-7 PP data conversion unit 52 refers to data [0, 1, 2, 3]. If data [0, 1, 2, 3]=[1, 1, 0, 0], data [0, 1, 2, 3]=[0, 1, 0, 0], or data [0, 1, 2, 3]=[1, 0, 0, 0], the 1-7 PP data conversion unit 52, having detected (0011), (0010), or (0001), determines a conversion pattern based on the conversion table shown in Table 2, as described earlier. Then, a channel-bit sequence obtained by the conversion is stored in cbit[0, 1, 2, 3, 4, 5]. At this time, 1 is stored in a register representing a modulation-delimiter position corresponding to cbit[5].

If data [0, 1, 2, 3]=[0, 0, 0, 0.], a conversion pattern is not determined with a constraint length r=2, so that a new data sequence is sequentially input. When two data have been newly input (six data in total), the 1-7 PP data conversion unit 52 refers to data [0, 1, 2, 3, 4, 5]. If data [0, 1, 2, 3, 4, 5]=[1, 1, 0, 0, 0, 0] or data [0, 1, 2, 3, 4, 5]=[1, 0, 0, 0, 0, 0], the 1-7 PP data conversion unit 52, having detected (000011) or (000001), determines a conversion pattern based on the conversion table shown in Table 2, as described earlier. Then, a channel-bit sequence obtained by the conversion is stored in cbit[0, 1, 2, 3, 4, 5, 6, 7, 8]. At this time, 1 is stored in a register representing a modulation-delimiter position corresponding to cbit[8].

If data [0, 1, 2, 3, 4, 5]=[0, 0, 0, 0, 0, 0] or data [0, 1, 2, 3, 4, 5]=[0, 1, 0, 0, 0, 0], a conversion pattern is not determined with a constraint length of r=3, so that a new data sequence is sequentially input. When two data have been newly input (eight data in total), the 1-7 PP data conversion unit 52 refers to data [0, 1, 2, 3, 4, 5, 6, 7] to determine a conversion pattern based on the conversion table shown in Table 2, as described earlier.

More specifically, if data [0, 1, 2, 3, 4, 5, 6, 7]= [0, 0, 0, 0, 0, 0, 0, 0], data [0, 1, 2, 3, 4, 5, 6, 7]=[1, 0, 0, 0, 0, 0, 0, 0], data [0, 1, 2, 3, 4, 5, 6, 7]=[0, 1, 0, 0, 0, 0, 0, 0], data [0, 1, 2, 3, 4, 5, 6, 7]=[1, 1, 0, 0, 0, 0, 0, 0], data [0, 1, 2, 3, 4, 5, 6, 7]=[0, 0, 0, 0, 1, 0, 0, 0, 0], data [0, 1, 2, 3, 4, 5, 6, 7]=[1, 0, 0, 1, 0, 0, 0, 0], data [0, 1, 2, 3, 4, 5, 6, 7]=[0, 1, 0, 1, 0, 0, 0], or if data [0, 1, 2, 3, 4, 5, 6, 7]=[1, 1, 0, 1, 0, 0, 0, 0], the 1-7 PP data conversion unit 52, having detected (00000000), (00000001), (00000010), (00000011), (00001000), (00001001), (00001010), or (00001011), operates as described earlier, using the conversion codes with a constraint length r=4 in the conversion table shown in Table 2 to achieve conversion into "010100100100", "010100000010", "0.10100000001", "010100000101", "000100100100", "000100000010", "000100000001", or "000100000101". A channel-bit sequence obtained by the conversion is stored in cbit[0, 1, 2, 3, 4, 5, 6, 7, 8, 9, 10, 11]. At this time, 1 is stored in a register representing a modulation-delimiter position at a particular position.

More specifically, if data [0, 1, 2, 3, 4, 5, 6, 0.7]= [0, 0, 0, 1, 0, 0, 0, 0] or if data [0, 1, 2, 3, 4, 5, 6, 7] =[0, 0, 0, 0, 0, 0, 0, 0], as the modulation-delimiter position, 1 is stored in a register representing a modulation-delimiter position corresponding to cbit[11] of cbit[0, 1, 2, 3, 4, 5, 6, 7, 8, 9, 10, 11].

Furthermore, if data [0, 1, 2, 3, 4, 5, 6, 7]=[1, 0, 0, 1, 0, 0, 0, 0], data [0, 1, 2, 3, 4, 5, 6, 7]=[0, 1, 0, 1, 0, 0, 0, 0], data [0, 1, 2, 3, 4, 5, 6, 7]=[1, 1, 0, 1, 0, 0, 0, 0], data [0, 1, 2, 3, 4, 5, 6, 7]=[1, 0, 0, 0, 0, 0, 0, 0], data [0, 1, 2, 3, 4, 5, 6, 7]=[0, 1, 0, 0, 0, 0, 0, 0], or if data [0, 1, 2, 3, 4, 5, 6, 7]=[1, 1, 0, 0, 0, 0, 0, 0], as the modulation-delimiter position, 1 is stored in registers representing modulation-delimiter positions corresponding to cbit[11] and cbit[2] of cbit[0, 1, 2, 3, 4, 5, 6, 7, 8, 9, 10, 11].

In Table 2, conversion patterns not mentioned above exist in the termination table. Operations for such conversion patterns are basically the same as the operations described above. That is, a conversion pattern is determined when a match is found in the termination table shown in Table 2 and a position where a synchronization signal is inserted is detected. The modulation-delimiter position in this case is given at one point at the position of the last bit of channel bits for each element determined.

As described above, all the patterns are converted from an input data sequence into a channel-bit sequence, and modulation-delimiter information is given. Then, a next pattern conversion starts again from a constraint length r= 1 after a pattern has been determined and modulation-delimiter information has been generated, and the operation described above is repeated. At this time, the channel-bit sequence and the modulation-delimiter information undergoes conversion before being output by the 18-bit register shown in FIG. 5, and the channel-bit sequence and the modulation-delimiter information having undergone conversion are supplied to the synchronization-signal inserting unit 53 shown in FIG. 6.

Referring back to FIG. 6, the modulation-delimiter detecting unit 81 refers to the register representing modulation-delimiter information to detect modulation-delimiter positions.

Similarly to the case described above, the modulation-delimiter detecting unit 91 refers to the register representing modulation-delimiter information to detect modulation-delimiter positions. In this case, the processing executed by the 1-7 PP data conversion unit 52 is executed by the 1-7 PP data conversion unit 72, and the processing executed by the synchronization-signal inserting unit 53 is executed by the synchronization-signal inserting unit 73.

With regard to the relationship between an input data sequence and a corresponding codeword sequence, since the conversion ratio m: n is 2:3 in this example, the amount of codeword data of 3 corresponds to the amount of data word data 2. Thus, of an input data sequence, only particular two data words are input during two clock cycles, and then input is stopped for one clock cycle. Thus, the deviation relating to the conversion ratio between input data and output code is adjusted. This relationship is shown in data sequences and channel-bit sequences shown in FIGS. 8A, 8B, 9A, 9B, 10A, and 10B.

FIGS. 8A and B are diagrams showing how the modulation-delimiter detecting unit 81 shown in FIG. 6 detects a modulation delimiter. In FIGS. 8A and B, time elapses from left to right, and a data sequence is sequentially input to the register from the left and converted into a channel-bit sequence.

Referring to FIG. 8A, a data sequence of two bits (11) is converted into "101", and '1' is stored at a position of the register representing a modulation delimiter, corresponding to "1" at the beginning of "101,". As described earlier, the modulation-delimiter detecting unit 81 refers to the register to detect a modulation-delimiter position, and controls a modulation-delimiter signal.

A data sequence of eight bits (00000000) is converted into "010100100100", and '1' is stored at a position of the register representing a modulation delimiter, corresponding to "0" at the beginning of "010100100100". As described earlier, the modulation-delimiter detecting unit 81 refers to the register to detect a modulation-delimiter position, and controls a modulation-delimiter signal.

Similarly, a data sequence of four bits (0011) is converted into "010100", and '1' is stored at a position of the register representing a modulation delimiter, corresponding to "0" at the beginning of "010100". As described earlier, the modulation-delimiter detecting unit 81 refers to the register to detect a modulation-delimiter position, and controls a modulation-delimiter signal.

Similarly, referring to FIG. 8B, a two-bit data sequence (11) is converted into "101", and '1' is stored at a position of the register representing a modulation delimiter, corresponding to the "1" at the beginning of "101". As described earlier, the modulation-delimiter detecting unit 81 refers to the register to detect a modulation-delimiter position, and controls a modulation-delimiter signal.

A data sequence of eight bits (00000001) is converted into "010100000010", and '1' is stored at positions of the register representing modulation delimiters, corresponding to "0" at the beginning of "010100000010" and "0" at the third position from the right thereof. As described earlier, the modulation-delimiter detecting unit 81 refers to the register to detect modulation-delimiter positions, and controls a modulation-delimiter signal.

Similarly, with regard to a data sequence of four bits (0011), '1' is stored at a position of the register representing a modulation delimiter, corresponding to "0" at the beginning of "010100". As described earlier, the modulation-delimiter detecting unit 81 refers to the register to detect a modulation-delimiter position, and controls a modulation-delimiter signal.

As described above, the number of modulation delimiters vary depending on conversion patterns with a constraint length i=4.

The modulation-delimiter detecting unit 81 may integrate modulation-delimiter positions for pattern conversion with a constraint length i=4, i.e., with eight data, into a foremost one point, and output it as a modulation-delimiter signal. This also allows the operation of the DSV-control-bit determining unit 31. In this case, a difference arises in the results of calculation of the segment DSVs; however, the same result can be obtained for the accumulated DSV.

The modulation-delimiter signal generated by the modulation-delimiter detecting unit 81 is supplied to the valid-delimiter detecting unit 82. The valid-delimiter detecting unit 82, upon receiving the modulation-delimiter signal, detects a valid-delimiter position based on a DSV-segment-delimiter signal supplied from the 1-7 PP data conversion unit 52, and supplies a valid-delimiter signal to the segment-DSV calculating unit 55 and the DSV-control-bit determining unit 62.

The modulation-delimiter detecting unit 91 operates similarly to the modulation-delimiter detecting unit 81. A modulation-delimiter signal generated by the modulation-delimiter detecting unit 91 is supplied to the valid-delimiter detecting unit 92. The valid-delimiter detecting unit 92, upon receiving the modulation-delimiter signal, detects a valid-delimiter position based on a DSV-segment-delimiter signal supplied from the 1-7 PP data conversion unit 72, and supplies a valid-delimiter signal to the segment-DSV calculating unit 75 and the DSV-control-bit determining unit 62.

Figure 9A:
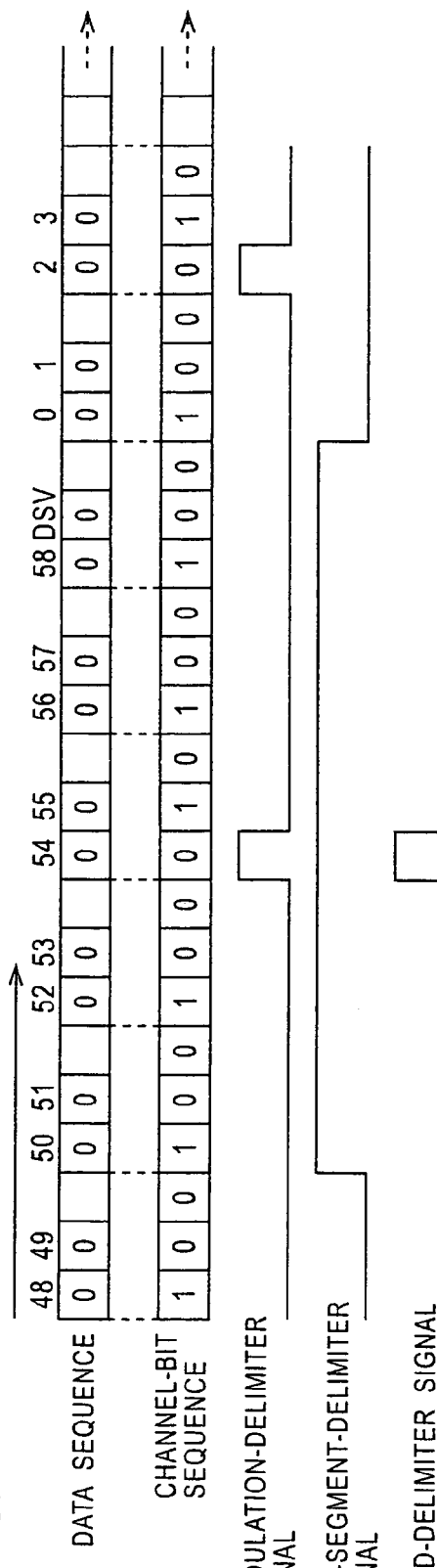
FIG. 9A is a diagram showing an example of how a valid-delimiter detecting unit controls a valid-delimiter signal.

FIGS. 9A and B are diagrams showing an example of how a valid-delimiter detecting unit controls a valid-delimiter signal. In FIGS. 9A and B, time elapses from left to right, and a data sequence is sequentially input to the register from the left and converted into a channel-bit sequence.

In FIGS. 9A and B, DSV control bits are inserted into a data sequence at an interval of 60 data. That is, a DSV control bit is inserted after a succession of 59 data of the data sequence. Furthermore, a DSV-segment-delimiter position is controlled so as to be generated at the position of 51st data (data sequence 50 in FIGS. 9A and B) in a DSV segment of the 60th data. That is, a DSV-segment-delimiter-position signal is set such that a DSV-segment-delimiter position is given 9 data ahead of the position of a DSV control bit, considering that a data sequence is converted into a variable-length code based on the 1-7 PP conversion table.

Since the value of the DSV control bit is arbitrary, insertion of a DSV control bit into a data sequence causes a difference in a channel-bit sequence obtained by the conversion. That is, a DSV value can be calculated more accurately if a next DSV control bit yet to be determined does not affect conversion of a data sequence in calculating a segment DSV value of a segment controlled by a single DSV control bit. Thus, a DSV-segment-delimiter position is set at a position that is different from an actual delimiter position in a DSV segment.

In the 1-7 PP conversion table shown in Table 2, the maximum size of a data sequence that is referred to for a single modulating operation is eleven data (11011100000). Furthermore, it is ensured only for conversion up to 49th data that conversion takes place by the unit of two data and that a data sequence is converted not including a DSV control bit of a next DSV segment (the data sequence is not affected by a next DSV control bit). As for conversion of the subsequent 51st data, the maximum data sequence that is referred to for a single modulating operation includes a DSV control bit of a next DSV segment. Thus, the position of a DSV-segment delimiter in the DSV segment of the 60th data is set at the 51st data or later.

The DSV-segment-delimiter position is related to low-frequency suppression characteristics. As the position is shifted backward, low frequencies are suppressed, desirably improving the performance of the modulating apparatus. From what has been described above, in FIGS. 9A and B, a DSV-segment-delimiter position is set at the 51st data (data sequence 50 in FIGS. 9A and B).

Consequently, in a DSV segment of a DSV-block-delimiter-position signal, only one DSV control bit is inserted.

In FIG. 9A, the DSV segment is 60 data, and a DSV control bit having a value of '0' is inserted in the 60th data. Furthermore, the data sequence is composed of '0's only, and (00000000) is repeatedly converted into "010100100100". The six data at the beginning, together with the preceding two data (00) not shown, is treated as (00000000) for conversion. At this time, a DSV control bit is included in the next conversion unit consisting of eight data (00000000).

As described earlier, in the case of (00000000), only one modulation delimiter is provided, at the beginning of the pattern. That is, in the case of FIG. 9A, modulation delimiters are provided at the 55th data (data sequence 54 in FIGS. 9A and B) and the 3rd data in the next DSV segment (data sequence 2 in FIGS. 9A and B). Thus, the modulation-delimiter detecting unit 81 supplies, to the valid-delimiter detecting unit 82, a modulation-delimiter signal that is controlled such that the 55th data and the 3rd data of the next DSV segment are '1'.

Since the DSV-segment-delimiter position is at the 51st data as described earlier, the 1-7 PP data conversion unit 52 supplies, to the valid-delimiter detecting unit 82, a DSV-segment-delimiter signal having a value of '1' at and subsequently to the 51st data (data sequence 50 in FIGS. 9A and B). The value of the DSV-segment-delimiter signal is returned to '0' when the segment-DSV-control processing has been completed. For example, as shown in FIG. 9A, the DSV-segment-delimiter signal is returned to '0' at each 1st data (data sequence 0 in FIGS. 9A and B).

The valid-delimiter detecting unit 82, based on the modulation-delimiter signal and the DSV-segment-delimiter signal supplied thereto, detects the 55th data (data sequence 54 in FIGS. 9A and B), which is the first modulation delimiter that occurs after the DSV-delimiter position becomes '1', as a valid delimiter. The valid-delimiter detecting unit 82 then generates a valid-delimiter signal that is controlled such that the 55th data is '1', and supplies the valid-delimiter signal to the segment-DSV calculating unit 55 and the DSV-control-bit determining unit 62.

Figure 9B:
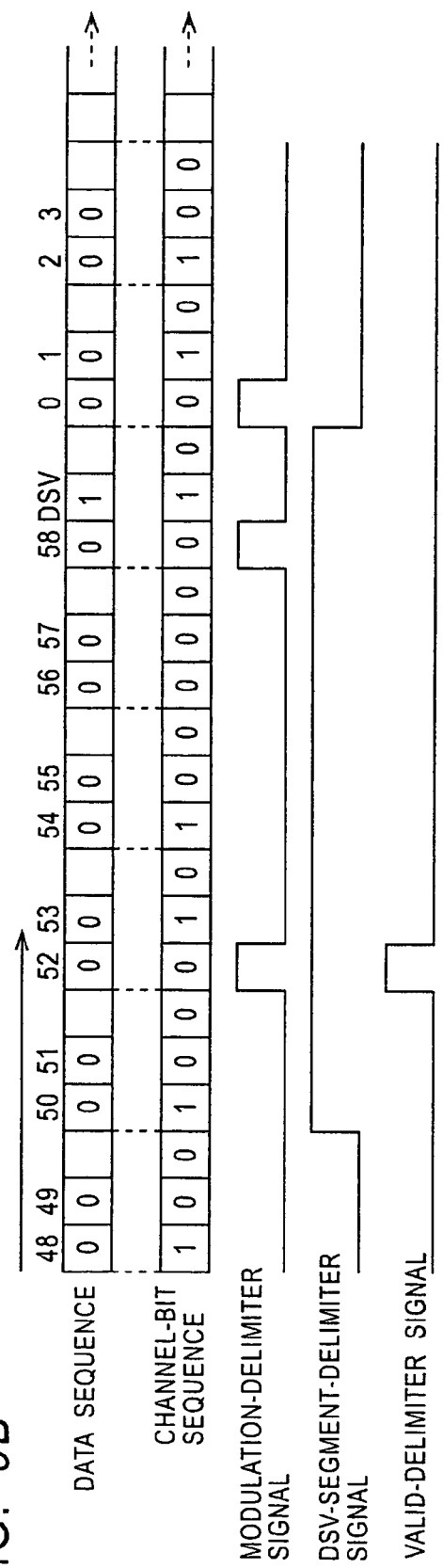
FIG. 9B is a diagram showing an example of how a valid-delimiter detecting unit controls a valid-delimiter signal.

On the other hand, FIG. 9B is a diagram showing how the DSV-control-bit-1 adding unit 71 inserts a DSV control bit having a value of '1' at the 60th data while leaving other data '0'. The four data at the beginning, together with the preceding four data (0000) not shown, are treated as (00000000) for conversion.

At this time, a DSV control bit is included in the next conversion unit consisting of eight data (00000001).

(00000001), which includes a DSV control bit, is converted into "010100000010". In this case, as described earlier, modulation delimiters are provided at two points, at the 53rd data (data sequence 52 in FIGS. 9A and B) and the 59th data (data sequence 58 in FIGS. 9A and B).

In the case of FIG. 9B, the modulation-delimiter position differs from that in the case of FIG. 9A. Usually, when a random pattern is input, a data sequence with a DSV control bit having a value of '0' and a data sequence with a DSV control bit having a value of '1' converge as time elapses, and modulation-delimiter positions match in the proximity of modulation delimiters. However, in the case of a particular pattern, sometimes, conversion does not occur as in the above example, and modulation-delimiter positions do not match even in the proximity of modulation delimiters, affecting DSV segments.

Even in that case, the valid-delimiter detecting units 82 and 92 output valid-delimiter signals with a mutual deviation as they are, as in the normal case.

In FIGS. 9A and B, DSV segments are shown without consideration of a delay associated with the registers shown in FIG. 5. However, without limitation to the above arrangement, for example, DSV segments may be counted at the register cbit[0] for storing a channel-bit sequence, shown in FIG. 5, referring to a data sequence, a channel-bit sequence, and modulation-delimiter information at cbit[17]. In that case, the data sequence, the channel-bit sequence, and the modulation-delimiter information that are referred to are delayed by 18 bits relative to the counter of DSV segments, as shown in FIG. 5. However, the valid-delimiter detecting units 82 and 92 detect valid delimiters similarly to the example described above.

As described above, based on the timing of the valid delimiter detected, the segment-DSV calculating unit 55 calculates a segment-DSV value from the channel-bit sequence of the relevant DSV segment, and supplies the segment-DSV value to the adder 56. Similarly, the segment-DSV calculating unit 75 calculates a segment DSV value, and supplies the segment-DSV value to the adder 76 based on the timing of the valid delimiter detected.

The adder 56 adds an accumulated DSV value supplied from the accumulated-DSV processing unit 61 to the segment-DSV value supplied thereto, and supplies an accumulated-DSV value newly calculated to the DSV-control-bit determining unit 62. Similarly, the adder 76 adds an accumulated DSV value supplied from the accumulated-DSV processing unit 61 to the segment-DSV value supplied thereto, and supplies an accumulated-DSV value newly calculated to the DSV-control-bit determining unit 62.

The DSV-control-bit determining unit 62, having received these two new DSV values, determines a value of a DSV control bit to be inserted into the data sequence based on the timings of valid-delimiter signals supplied from the valid-delimiter detecting units 82 and 92. The DSV-control-bit determining unit 62 selects, of the two newly calculated accumulated-DSV values supplied from the adders 56 and 76, one with a smaller absolute value. The DSV-control-bit determining unit 62, having determined the value of the DSV control bit to be inserted, supplies the information to the DSV-control-bit specified-position inserting unit 32, and supplies the new accumulated-DSV value selected to the accumulated-DSV processing unit 61.

Furthermore, the DSV-control-bit determining unit 62 activates a swapping operation for controlling the values of registers that are used for calculation of a next DSV segment. That is, the DSV-control-bit determining unit 62 supplies information that specifies the selected line to the 1-7 PP data conversion unit 52, the synchronization-signal inserting unit 53, the NRZI modulation unit 54, the segment-DSV calculating unit 55, the 1-7 PP data conversion unit 72, the synchronization-signal inserting unit 73, the NRZI modulation unit 74, and the segment-DSV calculating unit 75. Then, the values of the registers referred to by the components of the selected line are stored in place of the values of the registers referred to by the components of the opposite line.

FIGS. 10A and B are diagrams showing how the DSV-control-bit determining unit 62 determines a swap timing.

Referring to FIG. 10A, a valid-delimiter signal based on a data sequence including a DSV control bit having a value of '0' is supplied to the DSV-control-bit determining unit 62. The DSV-control-bit determining unit 62, at a next timing of a valid delimiter, determines a DSV control bit. Then, at a yet next timing, a swapping operation is executed, controlling the registers so that the contents of the registers are matched with the contents of the registers of the selected line.

Referring to FIG. 10B, a valid-delimiter signal based on a data sequence including a DSV control bit having a value of '1' is supplied to the DSV-control-bit determining unit 62. In the case of FIG. 10B, the valid-delimiter position differs as compared with the case of FIG. 10A. In this case, the DSV-control-bit determining unit 62 determines a DSV control bit at a timing next to occurrences of valid delimiters on both lines. That is, in the case of FIGS. 10A and B, since the valid-delimiter position is later in FIG. 10A than in FIG. 10B, determination is carried out at a timing next to the valid-delimiter position in FIG. 10A.

Now, let it be supposed that the line associated with a DSV control bit having a value of '0' is selected. Then, the DSV-control-bit determining unit 62 supplies the new accumulated-DSV value, supplied from the adder 56, to the accumulated-DSV processing unit 61. Furthermore, the DSV-control-bit determining unit 62 supplies a result of determination to the DSV-control-bit specified-position inserting unit 32, and also to the 1-7 PP data conversion unit 52, the synchronization-signal inserting unit 53, the NRZI modulation unit 54, the segment-DSV calculating unit 55, the 1-7 PP data conversion unit 72, the synchronization-signal inserting unit 73, the NRZI modulation unit 74, and the segment-DSV calculating unit 75.

Then, the contents of the register of the 1-7 PP data conversion unit 52, on the line associated with the selected value 101 of the DSV control bit, are stored in the 1-7 PP data conversion unit 72. Similarly, the contents of the register of the synchronization-signal inserting unit 53 are stored in the synchronization-signal inserting unit 73, the contents of the register of the NRZI modulation unit 54 are stored in the NRZI modulation unit 74, and the contents of the register of the segment-DSV calculating unit 55 are stored in the segment-DSV calculating unit 75. By the swapping operation described above, the continuity of data is maintained.

Although a case where the valid-delimiter positions differ is shown in FIGS. 10A and B, a similar operation is also executed in a case where the valid-delimiter positions are the same. That is, the DSV-control-bit determining unit 62 determines a DSV control bit at a timing next to the valid delimiter. Then, the DSV-control-bit determining unit 62, at a yet next timing, executes a swapping operation, controlling the registers so that the contents will be matched with the contents of the registers of the selected line.

The example shown in FIGS. 10A and B has been described such that valid delimiters are detected without consideration of a delay associated with the registers shown in FIG. 5. However, without limitation to the example, a delay associated with the registers may be considered. Even in that case, the DSV-control-bit determining unit 62 executes an operation similar to that described above.

As described above, the DSV-control-bit determining unit 62, using the values of registers referred to by a line associated with a value selected as a DSV control bit to be inserted into a data sequence, updates (swaps) the values of registers on the opposite line not selected, so that the values of these registers match. At this time, the DSV-control-bit determining unit 62 controls the swap timing so that in each of the registers, a next DSV control bit or information including a next DSV control bit will not be stored.

The DSV-control-bit specified-position inserting unit 32, upon obtaining information regarding the value of the DSV control bit from the DSV-control-bit determining unit 62, inserts a DSV control bit having the specified value in the data sequence, and supplies the result to the data conversion unit 33. The data conversion unit 33 converts the data sequence including the DSV control bit into a channel-bit sequence with reference to the conversion table shown in Table 2, and supplies the result to the synchronization-signal inserting unit 34. The synchronization-signal inserting unit 34 inserts a predetermined synchronization signal in the channel-bit sequence, and supplies the result to the NRZI modulation unit 35. The NRZI modulation unit 35 converts the channel-bit sequence supplied thereto into a recording code sequence or a transmission code sequence, and outputs the code sequence.

The modulation apparatus 30 modulates an input data sequence in the manner described above. Thus, the modulation apparatus 30 is allowed to determine a value of a DSV control bit to be inserted more accurately.

A providing medium for providing a user with a computer program for executing the processing described above may be a recording medium such as an optical disc, a magneto-optical disc, a magnetic disc, a DVD-ROM, or a solid memory, or a communication medium such as a network or a satellite.

INDUSTRIAL APPLICABILITY

As described above, according to a modulation apparatus and method, and a DSV-control-bit generating method of the present invention, a more suitable DSV control is achieved by detecting a modulation delimiter and controlling a segment for calculation of a segment-DSV value.

What is claimed is:

1. A digital sum value (DSV) control bit generating method for generating a DSV control bit that is used for modulation in which a channel-bit sequence from an input bit sequence and generating code sequence from the channel-bit sequence generated, the DSV-control-bit generating method comprising:

a first post-insertion-bit-sequence-candidate generating step of inserting a first candidate bit for the DSV control bit at a predetermined position of the input bit sequence to generate a first post-insertion-bit-sequence candidate from the input bit sequence;

a second post-insertion-bit-sequence-candidate generating step of inserting a second candidate bit for the DSV control bit at the predetermined position of the input bit sequence to generate a second post-insertion-bit-sequence candidate from the input bit sequence;

a modulating step of modulating the first and second post-insertion-bit-sequence candidates based on a conversion rule of a variable-length code (d, k; m, n; r);

a synchronization-signal inserting step of inserting a synchronization signal including a unique pattern at a predetermined position into each of the modulated first and second post-insertion-bit-sequence candidates supplied from the modulating step, a modulation-delimiter detecting step of detecting a modulation delimiter that serves as a delimiter for conversion of the variable-length code in the modulating step;

a valid-delimiter detecting step of detecting a valid delimiter for controlling timing for determining a value of the DSV control bit, based on the modulation delimiter detected in the modulation-delimiter detecting step;

a DSV calculating step of calculating DSV values based on first and second channel-bit-sequence candidates generated respectively in the modulating step; and a DSV-control-bit determining step of determining either the first or the second candidate bit as the DSV control bit based on the DSV values calculated in the DSV calculating step, at the timing based on the valid delimiter detected in the valid-delimiter detecting step.

* * * * *